United States Patent
Iyatani et al.

(10) Patent No.: US 10,269,998 B2
(45) Date of Patent: Apr. 23, 2019

(54) SOLAR BATTERY MODULE, AND METHOD OF MANUFACTURING SOLAR BATTERY MODULE

(71) Applicant: SHARP KABUSHIKI KAISHA, Osaka-shi, Osaka (JP)

(72) Inventors: Kazushi Iyatani, Osaka (JP); Haruo Okuno, Osaka (JP); Masakazu Kobayashi, Osaka (JP); Toshimi Kai, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 465 days.

(21) Appl. No.: 14/405,315

(22) PCT Filed: May 9, 2013

(86) PCT No.: PCT/JP2013/063035
§ 371 (c)(1),
(2) Date: Dec. 3, 2014

(87) PCT Pub. No.: WO2013/183395
PCT Pub. Date: Dec. 12, 2013

(65) Prior Publication Data
US 2015/0162472 A1    Jun. 11, 2015

(30) Foreign Application Priority Data

Jun. 4, 2012 (JP) ................................ 2012-126746
Jun. 4, 2012 (JP) ................................ 2012-126747
(Continued)

(51) Int. Cl.
*H01L 31/048*    (2014.01)
*H01L 31/02*    (2006.01)
*H02S 40/34*    (2014.01)

(52) U.S. Cl.
CPC ...... *H01L 31/0488* (2013.01); *H01L 31/0201* (2013.01); *H02S 40/34* (2014.12); *Y02E 10/50* (2013.01)

(58) Field of Classification Search
CPC ............. H01L 31/0488; H01L 31/0201; H01L 31/048; H01L 31/02; H01L 31/18
See application file for complete search history.

(56) References Cited

U.S. PATENT DOCUMENTS 5,733,382 A * 3/1998 Hanoka ............. B32B 17/10036
                                                         136/251
2007/0125420 A1* 6/2007 Ezure ................... H01G 9/2031
                                                         136/263
(Continued)

FOREIGN PATENT DOCUMENTS

| JP | 2001-339088 | 12/2001 |
| JP | 2005-101383 | 4/2005 |
| JP | 2008-258269 | 10/2008 |

OTHER PUBLICATIONS

International Search Report for PCT/JP2013/063035 dated Jul. 30, 2013.

*Primary Examiner* — Golam Mowla
(74) *Attorney, Agent, or Firm* — Nixon & Vanderhye P.C.

(57) ABSTRACT

L-shaped positive electrode bus bar 11 and negative electrode bus bar 12 are provided along a vertical side 1b and a horizontal side 1c of the solar battery module 1, positive electrode output terminals 13a and 13b, and negative electrode output terminals 14a and 14b are led out from the long horizontal side 1c, and a positive electrode box 15, a negative electrode box 16, and the like are provided to the long horizontal side 1c. In addition, all solar battery cells 3 of first and second rows R1 and L2 are connected in series by using only one connection bus bar 7. Accordingly, even when the positive electrode box 15, the negative electrode
(Continued)

box 16, and the like are provided to the long horizontal side 1*c* of the solar battery module 1, the number of bus bars is small and the number of connection processes such as soldering is also small.

10 Claims, 22 Drawing Sheets

(30) Foreign Application Priority Data

| Jan. 16, 2013 | (JP) | ................................. | 2013-005655 |
| Feb. 15, 2013 | (JP) | ................................. | 2013-027591 |
| Feb. 15, 2013 | (JP) | ................................. | 2013-027592 |

(56) References Cited

U.S. PATENT DOCUMENTS

| 2008/0276981 | A1* | 11/2008 | Kinoshita | ......... | H01L 31/02242 |
|  |  |  |  |  | 136/244 |
| 2012/0012161 | A1* | 1/2012 | Lee | ....................... | H01L 31/048 |
|  |  |  |  |  | 136/251 |
| 2013/0220418 | A1* | 8/2013 | Heidtman | ............... | H02S 30/10 |
|  |  |  |  |  | 136/259 |

* cited by examiner

FIG. 6
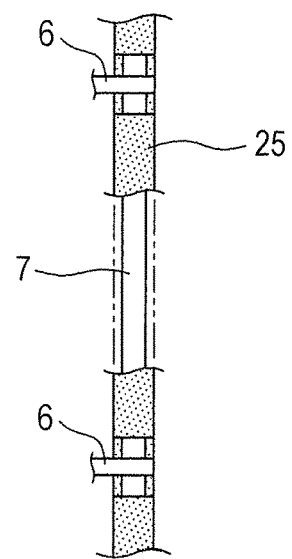
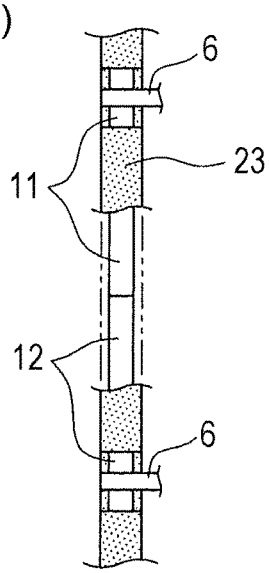
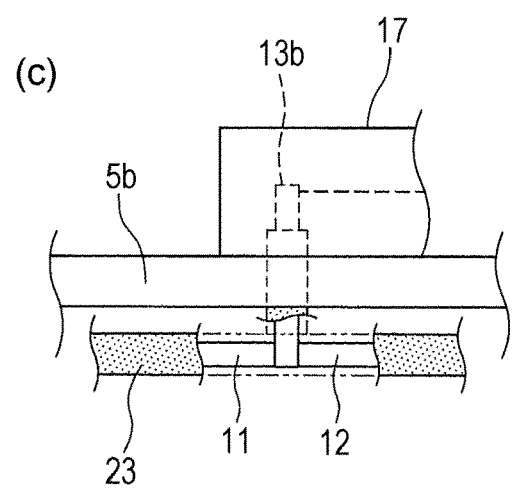

SOLAR BATTERY MODULE, AND METHOD OF MANUFACTURING SOLAR BATTERY MODULE

This application is the U.S. national phase of International Application No. PCT/JP2013/063035 filed 9 May 2013 which designated the U.S. and claims priority to JP 2012-126746 filed 4 Jun. 2012, JP 2012-126747 filed 4 Jun. 2012, JP 2013-005655 filed 16 Jan. 2013, JP 2013-027591 filed 15 Feb. 2013, and JP 2013-027592 filed 15 Feb. 2013, the entire contents of each of which are hereby incorporated by reference.

TECHNICAL FIELD

The present invention relates to a solar battery module that photoelectrically converts solar light, and a method of manufacturing the solar battery module, and more particularly, to a solar battery module with a laminated glass structure, and a method of manufacturing the solar battery module.

BACKGROUND ART

Various solar battery modules exist in accordance with a use or a manufacturing method thereof. As one of the solar battery modules, a solar battery module provided with a laminated glass structure is exemplified. The solar battery module with the laminated glass structure has a structure in which a plurality of solar battery cells that are electrically connected to each other are interposed between a light-receiving surface side glass and a non-light-receiving surface side glass, and thus the solar battery cells are sealed inside of the solar battery module. A current that is generated in the solar battery cells is taken out to the outside of the solar battery module by lead-out electrodes on a positive electrode side and a negative electrode side.

In the solar battery module with the laminated glass structure, solar light, which is transmitted through the light-receiving surface side glass and is incident to the inside of the solar battery module, is transmitted through a sealing resin located at a portion in which the solar battery cells are not present and reaches the non-light-receiving surface side glass, and the solar light that reaches the non-light-receiving surface side glass is transmitted to the outside of the solar battery module through the non-light-receiving surface side glass. Accordingly, the solar battery module with the laminated glass structure is suitably used as a so-called lighting-type solar battery module which is provided at a window, a roof, and the like, and which is capable of lighting with solar light even in a space that is located on a non-light-receiving surface side of the solar battery module.

An example of the lighting-type solar battery module is described in PTL 1. FIG. 36 is a plan view schematically illustrating the solar battery module as an example. As shown in FIG. 36, in a solar battery module 501, a plurality of solar battery cells 503 and the like are interposed between two sheets of light-transmitting substrates 502, and are sealed therebetween. In addition, the solar battery cells 503 are disposed in four columns in a vertical direction, the solar battery cells 503 are connected in series through an interconnector 504 and a bus bar 505, the solar battery cells 503 that are connected in series are connected to a terminal box 507 through a bus bar 506, and generated electric power of the solar battery cells 503 is output from the terminal box 507.

In the solar battery module 501, solar light is received on the light-receiving surfaces of the solar battery cells 503, electric power is generated by the solar battery cells 503, and the electric power is output. In addition, the solar light can be used for illumination through spaces between the solar battery cells 503 or an outer peripheral space.

In addition, in a case of a solar battery cell using a crystalline silicon substrate, it is necessary to make a sealing resin layer interposed between the light-receiving surface side glass and the light-none-receiving surface side glass thick so as to prevent cracking or chipping from occurring in the solar battery cells under a pressure environment during a sealing process. Therefore, the thickness of the solar battery module increases, and thus there is a greater exposed surface of the sealing resin to the outside at an end of the solar battery module. As a result, there is a problem that the sealing resin becomes discolored due to an increase in absorption of moisture in the sealing resin, or deterioration in characteristics of the solar battery cells tends to occur. In addition, there is also a problem that in the sealing process, the sealing resin that enters a softened state protrudes in large quantities from an end of the solar battery module.

As a method of solving the problems, for example, PTL 2 discloses a solar battery module in which a frame-shaped spacer member for securement of a space, in which a solar battery cell array, is disposed between a front surface plate glass and a rear surface side plate glass in a thickness direction of the solar battery cell array, and a method of manufacturing the solar battery module.

CITATION LIST

Patent Literature

PTL 1: Japanese Unexamined Patent Application Publication No. 2001-399088
PTL 2: Japanese Unexamined Patent Application Publication No. 2008-258269

SUMMARY OF INVENTION

Technical Problem

As a first problem of the invention, with regard to a lighting-type solar battery module, photoelectric conversion efficiency, reliability, and the like are demanded, and a design property is demanded when considering that the lighting-type solar battery module is provided for a window, a roof, and the like. In addition, a degree of freedom for disposition (a degree of freedom for design) of the solar battery cells is also further demanded for the design property and lighting.

For example, in the solar battery module 501 shown in FIG. 36, a mounting position of the terminal box 507 is located on a short-side side of the solar battery module 501, but as the mounting position, a long-side side of the solar battery module 501 may be demanded in some cases. As is the case with the solar battery module 501 shown in FIG. 36, if the solar battery cells 503 are connected to each other, and then the mounting position of the terminal box 507 is moved to the long-side side of the solar battery module 501, a connection configuration as shown in FIG. 37 is obtained.

However, in the solar battery module 501 shown in FIG. 37, the number of columns of the solar battery cells 503 increases, and the number of the bus bars 505 that connect the columns to each other and the number of connection portions increase. Therefore, the connection configuration of the solar battery cells 503 becomes complicated, and thus the number of components and connection processes such as soldering increase.

In addition, even in any of the solar battery modules 501 shown in FIG. 36 and FIG. 37, a space that does not contribute to any of electric power generation and lighting is broader when considering that the bus bars 505 and 506 are arranged in parallel on a two-dimensional plane.

In consideration of the first problem, an object of the invention is to provide a solar battery module in which a connection configuration of solar battery cells is not complicated and which is capable of suppressing an increase in the number of components and in a connection process such as soldering even in a case where generated electric power is output from a long-side side of the solar battery module.

As a second problem of the invention, PTL 2 does not specifically disclose a method of leading out the lead-out electrode to the outside of the solar battery module.

In a process of sealing the solar battery module, in a case where a sealing resin which enters a softened state protrudes from an end of the solar battery module and comes into contact with the lead-out electrode, there is a problem that it is difficult to remove the sealing resin.

In consideration of the second problem, another object of the invention is to provide a solar battery module and a method of manufacturing a solar battery module in which in the sealing process, the sealing resin is prevented from protruding from the end of the solar battery module to prevent the sealing resin from coming into contact with the solar battery module.

As a third problem of the invention, in the structure and the manufacturing method which are disclosed in PTL 2, there is a problem that protrusion of the sealing resin from the end of the solar battery module is not sufficiently prevented in the process of sealing the solar battery module, and thus a positional deviation occurs in the solar battery cells in some cases.

In consideration of the third problem, still another object of the invention is to provide a solar battery module in which the positional deviation of the solar battery cells is decreased by realizing a method of manufacturing the solar battery module in which protrusion of the sealing resin from the end of the solar battery module is prevented in the sealing process, and thus the positional deviation of the solar battery cells is less likely to occur.

Solution to Problem

According to an aspect of the invention, there is provided a solar battery module which includes a plurality of solar battery strings that are constituted by electrically connecting a plurality of solar battery cells in series, and which outputs generated electric power of the solar battery cells through a bus bar. The bus bar includes a first bar member which is connected to one of the plurality of solar battery strings, and a second bar member which is connected to a different one of the plurality of solar battery strings, the first bar member and the second bar member forming an L-shape, and the first bar member is disposed along one side of the solar battery module to be connected to electrodes of the solar battery cells, and the second bar member is disposed along the other side of the solar battery module which perpendicularly intersects the one side.

In addition, in the invention, output terminals, which output generated electric power of the solar battery cells, may be connected to the second bar member.

In addition, in the invention, as the bus bar, a positive electrode bus bar and a negative electrode bus bar may be provided, a first bar member and a second bar member of the positive electrode bus bar, and a first bar member and a second bar member of the negative electrode bus bar may be overlapped each other through an insulating member in a direction perpendicular to light-receiving surfaces of the solar battery cells, and the first bar member of the positive electrode bus bar and the first bar member of the negative electrode bus bar may be disposed along one side of the solar battery module to be connected to a positive electrode of one solar battery cell and negative electrode of another solar battery cell, respectively, and the second bar member of the positive electrode bus bar and the second bar member of the negative electrode bus bar may be disposed along the other side of the solar battery module which perpendicularly intersects the one side.

In addition, in the invention, a bypass diode may be provided to the other side.

In addition, in the invention, the insulating member may be folded back at a side end of the positive electrode bus bar or a side end of the negative electrode bus bar, and covers the side end.

According to another aspect of the invention, there is provided a solar battery module in which a plurality of electrically connected solar battery cells are sealed by a light-receiving surface side glass, a non-light-receiving surface side glass, and a sealing resin layer, and which has a lead-out electrode. A plurality of protrusion prevention walls are provided between the light-receiving surface side glass and the non-light-receiving surface side glass at a pair of opposite ends of the solar battery cells, and the lead-out electrode is led out to the outside of the solar battery module from between the protrusion prevention walls adjacent to each other.

In the solar battery module of the invention, the protrusion prevention wall may include an adhesive layer.

In the solar battery module of the invention, two pieces of the protrusion prevention walls may be disposed in a thickness direction of the solar battery module.

In the solar battery module of the invention, a width of the protrusion prevention wall may be 5 mm to 10 mm.

In the solar battery module of the invention, the protrusion prevention wall may be disposed at all ends of the solar battery module.

In the solar battery module of the invention, at least a part of the lead-out electrode may be coated with a protective film.

According to still another aspect of the invention, there is provided a method of manufacturing a solar battery module. The method includes a protrusion prevention wall disposing process of disposing a light-receiving surface side protrusion prevention wall on a non-light-receiving surface of a pair of opposite ends of a light-receiving surface side glass substrate, a mounting process of disposing a sealing resin, a plurality of solar battery cells, a non-light-receiving surface side protrusion prevention wall, a sealing resin, and a non-light-receiving surface side glass between the protrusion prevention walls that are disposed opposite to each other, and a sealing process of sealing the solar battery cells. The solar battery cells are electrically connected to a lead-out electrode. In the mounting process, the lead-out electrode is disposed on the light-receiving surface side protrusion prevention wall, and then the non-light-receiving surface side protrusion prevention wall is disposed on the lead-out electrode.

In the method of manufacturing a solar battery module of the invention, a spacer may be disposed at an end of the solar battery module, on which the protrusion prevention wall is disposed, on an outer side of the solar battery module.

In the method of manufacturing a solar battery module of the invention, the protrusion prevention wall may include an adhesive layer.

According to still another aspect of the invention, there is provided a solar battery module in which a plurality of electrically connected solar battery cells are sealed by a light-receiving surface side glass, a non-light-receiving surface side glass, and a sealing resin. A protrusion prevention wall is provided between the light-receiving surface side glass and the non-light-receiving surface side glass at a pair of opposite ends of the solar battery module, and a plurality of the protrusion prevention walls are disposed in a thickness direction of the solar battery module.

In the solar battery module of the invention, the protrusion prevention wall may include an adhesive layer.

In the solar battery module of the invention, two pieces of the protrusion prevention walls may be disposed in a thickness direction of the solar battery module.

In the solar battery module of the invention, a width of the protrusion prevention wall may be 5 mm to 10 mm.

In the solar battery module of the invention, the protrusion prevention wall may be disposed at all ends of the solar battery module.

In the solar battery module of the invention, in one end of the solar battery module, a lead-out electrode may be led out from between adjacent protrusion prevention walls.

According to still another aspect of the invention, there is provided a method of manufacturing a solar battery module. The method includes a protrusion prevention wall disposing process of disposing a plurality of protrusion prevention walls to overlap each other on a non-light-receiving surface on a pair of opposite ends of a light-receiving surface side glass substrate, a mounting process of disposing at least a sealing resin, a plurality of solar battery cells, a sealing resin, and a non-light-receiving surface side glass between the protrusion prevention walls that are disposed opposite to each other, and a sealing process of sealing the solar battery cells.

In the method of manufacturing a solar battery module of the invention, in the mounting process, a spacer may be disposed at an end of the solar battery module, on which the protrusion prevention wall is disposed, on an outer side of the solar battery module.

In the method of manufacturing a solar battery module of the invention, the protrusion prevention wall may include an adhesive layer.

Advantageous Effects of Invention

As a first effect, the following effect may be exemplified. In the invention, a bus bar constituted by the first bar member and the second bar member that forms an L-shape is used, the first bar member is disposed along one side of the solar battery module to be connected to electrodes of the solar battery cells, and the second bar member is disposed along the other side of the solar battery module which perpendicularly intersects the one side. Accordingly, generated electric power of the solar battery cells can be output from either the one side or the other side (short side and long side) of the solar battery module, and thus a degree of freedom for a connection configuration of the solar battery cells is raised. As a result, it is possible to realize simplification of the connection configuration.

As a second effect of the invention, according to the solar battery module and the method of manufacturing the solar battery module according to the invention, the sealing resin is prevented from protruding from an end of the solar battery module during the sealing process, and thus it is possible to prevent the sealing resin from being bonded to the lead-out electrode.

As a third effect, according to the solar battery module and the method of manufacturing the solar battery module according to the invention, the sealing resin is prevented from protruding from an end of the solar battery module during the sealing process, and thus a positional deviation of the solar battery cells is less likely to occur.

BRIEF DESCRIPTION OF DRAWINGS

FIGS. 6(a), 6(b), and 6(c) are enlarged views illustrating a portion I, a portion II, and a portion III in FIG. 2, respectively.

DESCRIPTION OF EMBODIMENTS

Hereinafter, embodiments of the invention will be described in detail with reference to the attached drawings.

<Embodiment 1>

Figure 1:
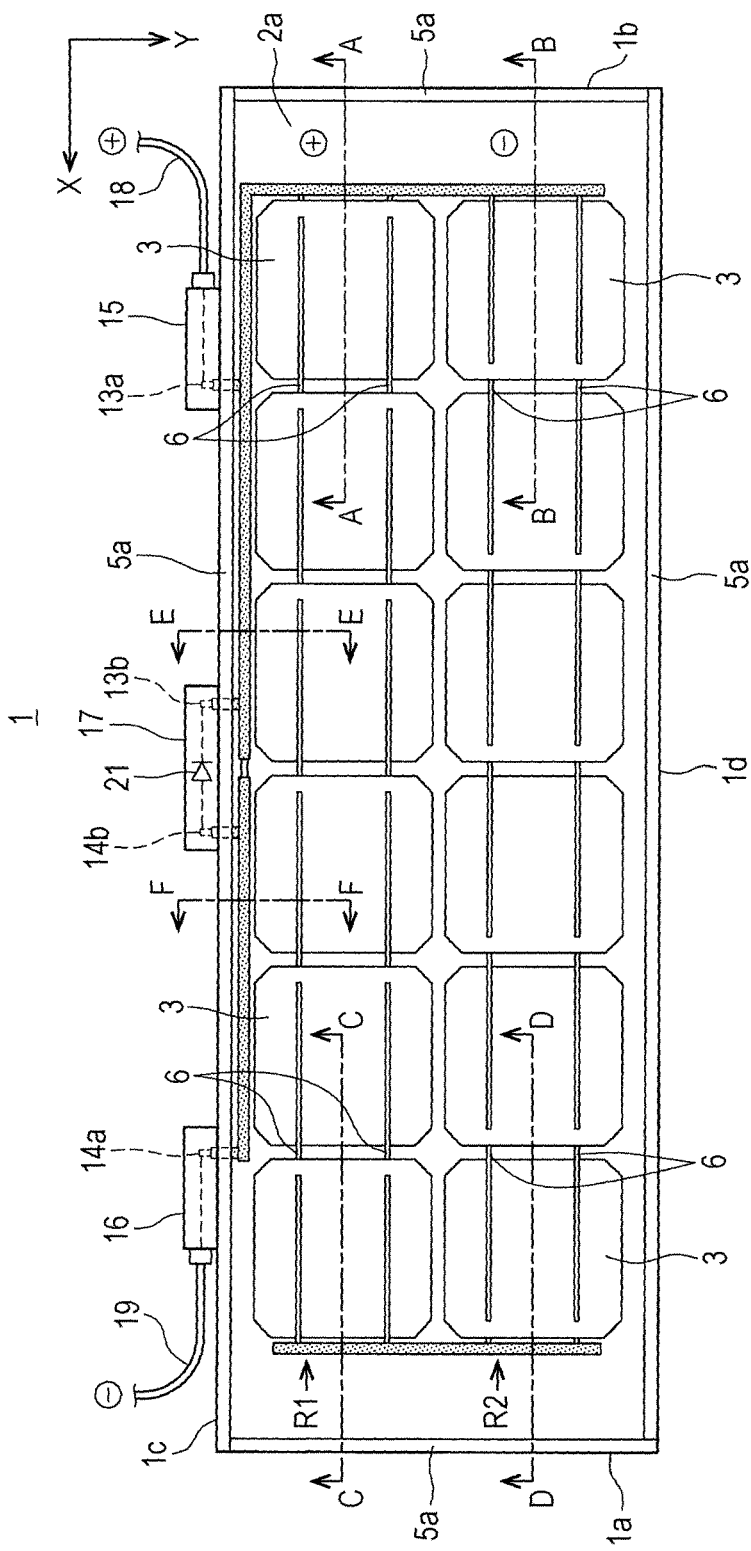
FIG. 1 illustrates Embodiment 1 of the invention, and is a plan view illustrating a solar battery module of the invention when viewed from a surface (light-receiving surface) side.
Figure 2:
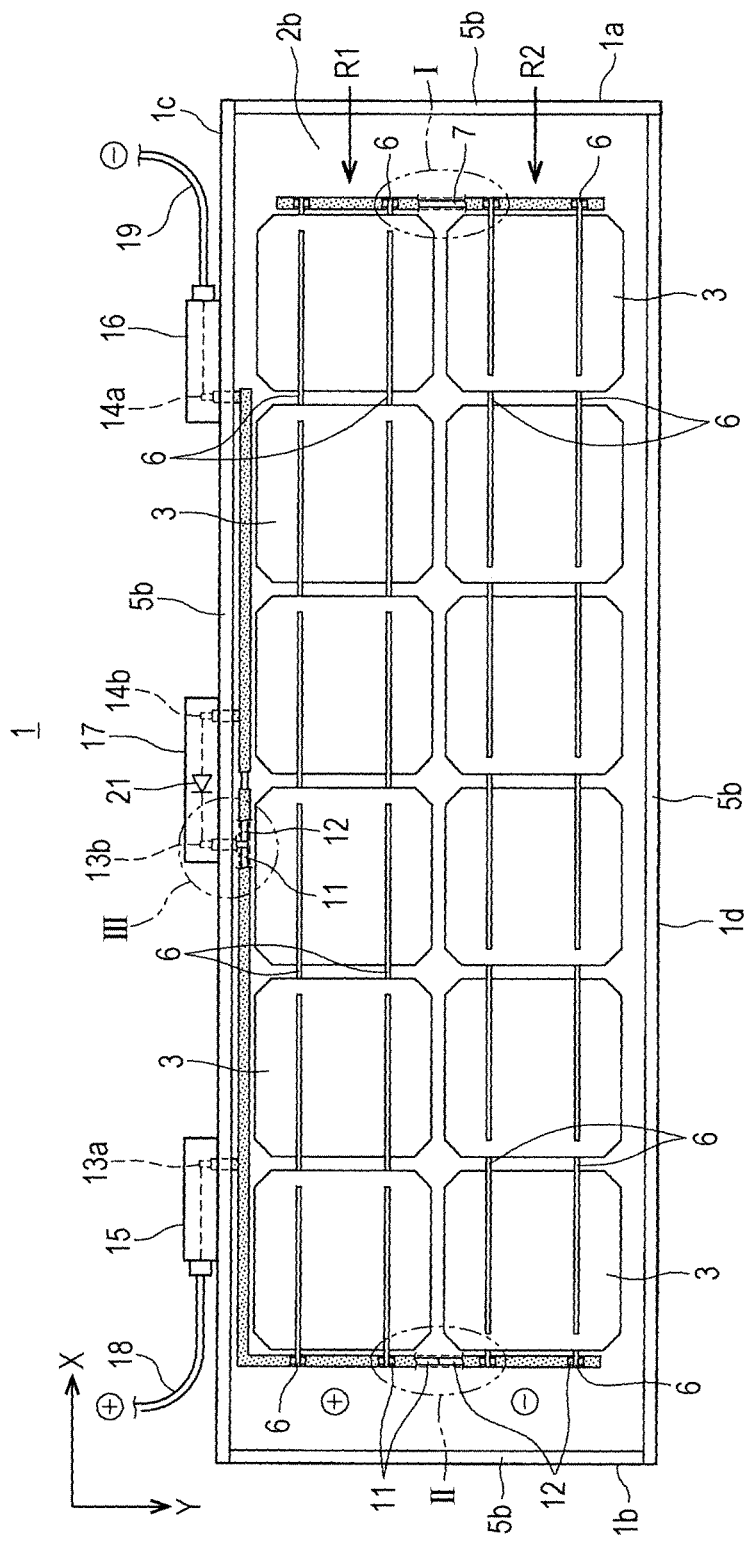
FIG. 2 is a rear view illustrating the solar battery module of FIG. 1 when viewed from a rear surface side.
Figure 3:
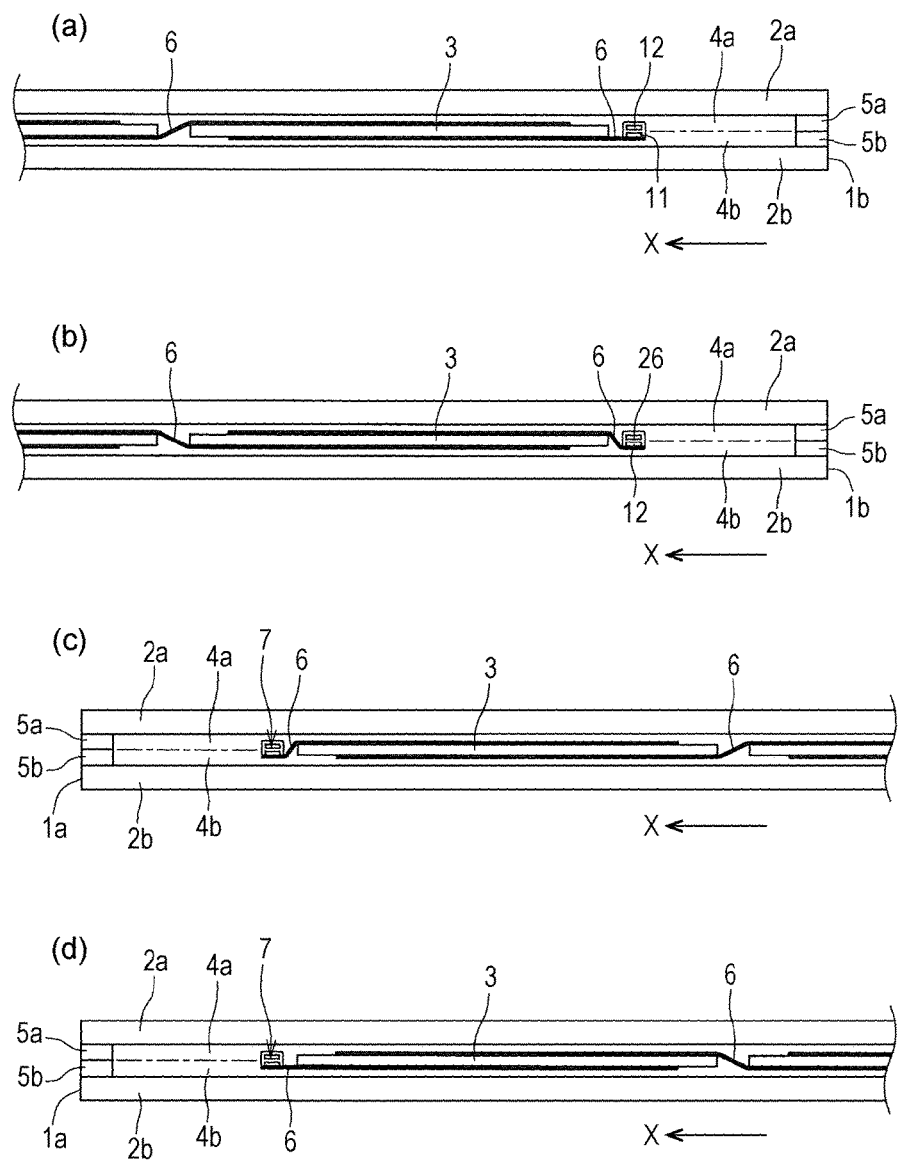
FIGS. 3(a), 3(b), 3(c), and 3(d) are cross-sectional views taken along line A-A of FIG. 1, line B-B of FIG. 1, line C-C of FIG. 1, and line D-D of FIG. 1, respectively.
Figure 4:
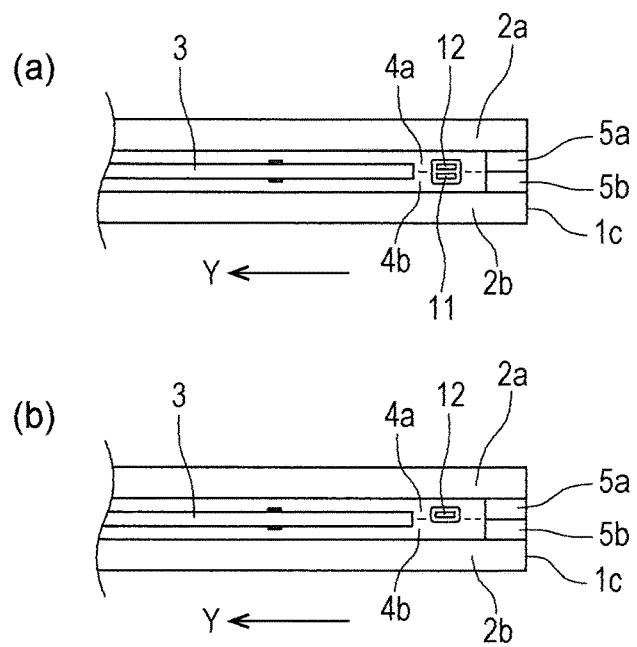
FIGS. 4(a) and 4(b) are cross-sectional views taken along line E-E of FIG. 1 and line F-F of FIG. 1, respectively.
Figure 5:
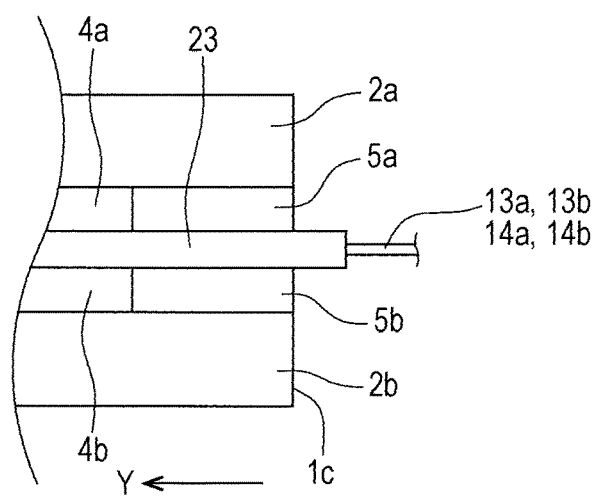
FIG. 5 is a cross-sectional view illustrating the vicinity of an output terminal of the solar battery module of FIG. 1.

FIGS. 1 and 2 are a plan view and a rear view of a solar battery module relating to Embodiment 1 of the invention when viewed from a surface (light-receiving surface) side and from a rear surface side, respectively. In addition, FIGS. 3(a), 3(b), 3(c), and 3(d) are cross-sectional views taken along line A-A of FIG. 1, line B-B of FIG. 1, line C-C of FIG. 1, and line D-D of FIG. 1, respectively. In addition, FIGS. 4(a) and 4(b) are cross-sectional views taken along line E-E of FIG. 1 and line F-F of FIG. 1, respectively. In addition, FIG. 5 is a cross-sectional view illustrating the vicinity of an output terminal of the solar battery module of FIG. 1. In addition, FIGS. 6(a), 6(b), and 6(c) are enlarged views illustrating a portion I, a portion II, and a portion III in FIG. 2, respectively. Furthermore, in FIGS. 1 to 5, a horizontal direction is set as X, and a vertical direction is set as Y.

As shown in FIGS. 1 to 6, a solar battery module 1 has a configuration in which a light-receiving surface glass plate 2a that faces a solar light incident direction, a sealing resin 4a, a plurality of solar battery cells 3, interconnection members of the solar battery cells 3, a sealing resin 4b, and a rear surface glass plate 2b sequentially overlap each other, the solar battery cells 3, the interconnection members of the solar battery cells 3, and the sealing resins 4a and 4b are interposed between the glass plates 2a and 2b, and the solar battery cells 3 and the interconnection members thereof are sealed by the sealing resins 4a and 4b. In addition, two strip-shaped double-sided adhesive tapes 5a and 5b are provided along sides of the glass plates 2a and 2b, respectively, and the double-sided adhesive tapes 5a and 5b are interposed between ends of the glass plates 2a and 2b in an overlapping manner.

In this embodiment, as the light-receiving surface glass plate 2a and the rear surface glass plate 2b, tempered glass having a thickness of approximately 4 mm is applied. In addition, heat-strengthened glass or non-tempered glass may be applied.

In addition, as the sealing resins 4a and 4b, ethylene vinyl acetate (EVA), which has a high transmittance in a visible light region, is applied. In addition, an ionomer resin, an olefin resin, and the like may be applied.

The double-sided adhesive tapes 5a and 5b have a configuration in which an adhesive layer is formed on both surfaces of a columnar base material. As the base material, an acrylic resin foamed body can be applied, and a urethane resin, a silicone resin, a butyl rubber, and the like may also be applied in addition to the acrylic resin foamed body. In addition, the double-sided adhesive tapes 5a and 5b are configured to prevent protrusion of the sealing resins 4a and 4b during a sealing process to be described later, or to prevent intrusion of rainwater and the like between the glass plates 2a and 2b. Furthermore, the width of the double-sided adhesive tapes 5a and 5b is preferably set to approximately 7 mm to 10 mm when considering that the double-sided adhesive tapes 5a and 5b do not contribute to solar power generation and lighting.

Next, an interconnection member of the solar battery module 1 will be described. For example, the solar battery cells 3 are obtained by using a crystalline silicon substrate. In each of the solar battery cells, two pairs of negative electrodes are provided to a light-receiving surface facing the solar light incident direction, and two pairs of positive electrodes are provided to a rear surface. In addition, the solar battery cells 3 are arranged at uniform intervals in a first row R1 and a second row R2 in a horizontal direction. For each of the first and second rows R1 and R2, two pairs of negative electrodes that are provided to the light-receiving surface of the solar battery cell 3, and two pairs of positive electrodes that are provided to a rear surface of another adjacent solar battery cell 3 are connected through two interconnectors 6, thereby forming a solar battery string that is constituted by connecting the solar battery cells 3 in series.

In addition, a connection bus bar 7 is disposed in the vicinity of ends on one side of the first and second rows R1 and R2 in parallel with a vertical side 1a of the solar battery module 1. The connection bus bar 7 is connected to interconnectors 6 that lead out from the negative electrodes of the solar battery cell 3 on one end side of the first row R1, and is connected to interconnectors 6 that lead out from the positive electrodes of the solar battery cell 3 on one end side of the second row R2. According to this, all of the solar battery cells 3 of the first and second rows R1 and R2 are connected to each other in series.

In addition, two L-shaped positive electrode bus bars 11 and negative electrode bus bars 12 are disposed along the other vertical side 1b of the solar battery module 1 and a horizontal side 1c that perpendicularly intersects the vertical side 1b. The positive electrode bus bar 11 and the negative electrode bus bar 12 overlap each other in a direction perpendicular to the light-receiving surfaces of the solar battery cells 3 through an insulating member. The positive electrode bus bar 11 is positioned in the nearer vicinity of the rear surface glass plate 2b in comparison to the negative electrode bus bar 12, and the negative electrode bus bar 12 is positioned in the nearer vicinity of the light-receiving surface glass plate 2a in comparison to the positive electrode bus bar 11.

The positive electrode bus bar 11 extends to an intermediate position between the first row R1 and the second row R2 in a vertical direction Y, is disposed in the vicinity of the other end of the first row R1, and is connected to the interconnectors 6 that lead out from the positive electrodes of the solar battery cell 3 on the other end of the first row R1. In addition, the positive electrode bus bar 11 extends to the vicinity of the center of the first and second rows R1 and R2 in the horizontal direction X, and a pair of positive electrode output terminals 13a and 13b, which is connected to the positive electrode bus bar 11, leads out to the outside of the glass plates 2a and 2b from between the double-sided adhesive tapes 5a and 5b.

The negative electrode bus bar 12 is provided to extend further in the vertical direction Y in comparison to the positive electrode bus bar 11, is disposed in the vicinity of the other end of the second row R2, and is connected to the interconnectors 6 that lead out from the negative electrodes of the solar battery cell 3 on the other end side of the second row R2. In addition, the negative electrode bus bar 12 extends further in the horizontal direction X in comparison to the positive electrode bus bar 11, and a pair of negative electrode output terminals 14a and 14b, which is connected to the negative electrode bus bar 12, leads out to the outside of the glass plates 2a and 2b from between the double-sided adhesive tapes 5a and 5b.

In addition, the solar battery module 1 includes a positive electrode box 15, a negative electrode box 16, and a diode box 17 which are bonded to an end surface of the horizontal side 1c. One positive electrode output terminal 13a that is connected to the positive electrode bus bar 11 and a positive electrode cable 18 are introduced to the positive electrode box 15, and the positive electrode output terminal 13a and the positive electrode cable 18 are connected to each other on an inner side of the positive electrode box 15. Similarly, one negative electrode output terminal 14a that is connected to the negative electrode bus bar 12 and a negative electrode cable 19 are introduced to the negative electrode box 16, and the negative electrode output terminal 14a and the negative electrode cable 19 are connected to each other on an inner side of the negative electrode box 16. In addition, the other positive electrode output terminal 13b that is connected to the positive electrode bus bar 11, and the other negative electrode output terminal 14b that is connected to the negative electrode bus bar 13 are introduced to the diode box 17, and the positive electrode output terminal 13b and the negative electrode output terminal 14b are connected to each other through a bypass diode 21 on an inner side of the diode box 17.

In the solar battery module 1, generated electric power obtained by the solar battery cells 3 is transmitted through the interconnectors 6, the connection bus bar 7, the positive electrode bus bar 11, the negative electrode bus bar 12, the positive electrode cable 18, and the negative electrode cable 19 and is output to the outside. In addition, in a case where the solar battery module 1 is used in a state of being connected to a different solar battery module in series, when only the solar battery module 1 enters a shadow and the solar battery module 1 is in a reverse bias state, a current from the different solar battery module flows through the bypass diode 21 and thus an electric power loss is reduced.

In addition, the solar battery cells 3 are disposed at uniform intervals, and the solar battery cells 3 are spaced away from the vertical sides 1a and 1b, and the horizontal sides 1c and 1d of the solar battery module 1. According to this, solar light is transmitted through the light-receiving surface glass plate 2a, passes through spaces between the solar battery cells 3 and an outer peripheral space, and is transmitted through the rear surface glass plate 2b. Accordingly, the solar battery module 1 can be used as a lighting type.

In addition, the positive electrode bus bar 11 and the negative electrode bus bar 12 overlap each other through the insulating member, and thus a solar light shielded area due to the bus bars 11 and 12 is further reduced in comparison to a case where the bus bars 11 and 12 are arranged in parallel on a two-dimensional plane. Accordingly, a lighting rate of the solar battery module 1 is improved. The lighting rate is expressed by (an amount of light transmitted through the solar battery module 1)/(an amount of light incident to the solar battery module 1).

In addition, the double-sided adhesive tapes 5a and 5b are interposed between ends of the light-receiving surface glass plate 2a and the rear surface glass plate 2b to overlap each other, and thus rainwater and the like are less likely to intrude between the glass plates 2a and 2b. Accordingly, durability and reliability of the solar battery module 1 are improved. In addition, the sealing resins 4a and 4b are not exposed to the outside air, and thus it is possible to prevent discoloring of the sealing resins 4a and 4b due to absorption of moisture and the like, and the like.

Figure 37:
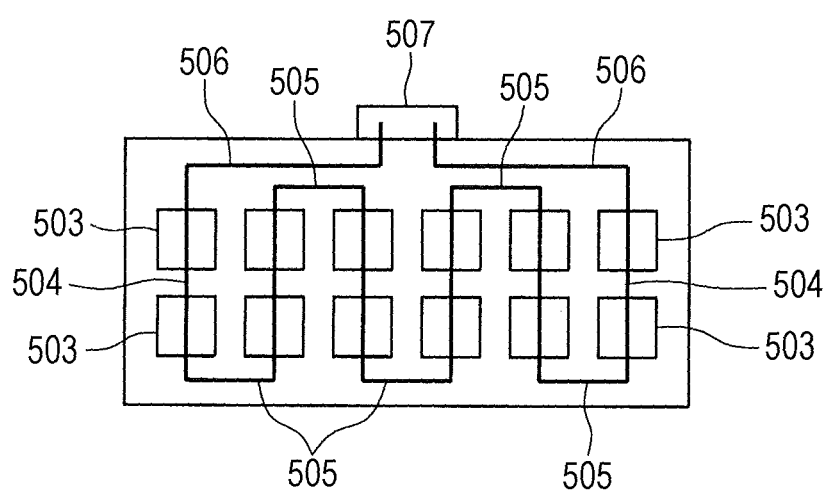
FIG. 37 is a view schematically illustrating another example of the solar battery module of the related art.

In addition, the L-shaped positive electrode bus bars 11 and negative electrode bus bars 12 are provided along the vertical side 1b and the horizontal side 1c of the solar battery module 1, the positive electrode output terminals 13a and 13b and the negative electrode output terminals 14a and 14b are led out from the long horizontal side 1c, and the positive electrode box 15, the negative electrode box 16, and the diode box 17 are provided to the long horizontal side 1c. In addition, all of the solar battery cells 3 of the first and second rows R1 and R2 are connected in series by using only one connection bus bar 7. Accordingly, when being compared to the solar battery module of the related art in FIG. 37 and the like, even though the positive electrode box 15, the negative electrode box 16, and the like are mounted to the long horizontal side 1c of the solar battery module 1, the number of the bus bars is small, the number of portions at which the bus bars are soldered is small, and it is possible to suppress an increase in the number of components and an increase in a connection process such as soldering.

In addition, since the positive electrode box 15, the negative electrode box 16, and the diode box 17 are collectively provided to the horizontal side 1c, in a case where the solar battery module 1 is mounted on a window frame, the boxes 15, 16, and 17 can be collectively hidden in a hollow space of a window frame bar, and thus it is possible to prevent a decrease in a design property of the window.

Figure 7:
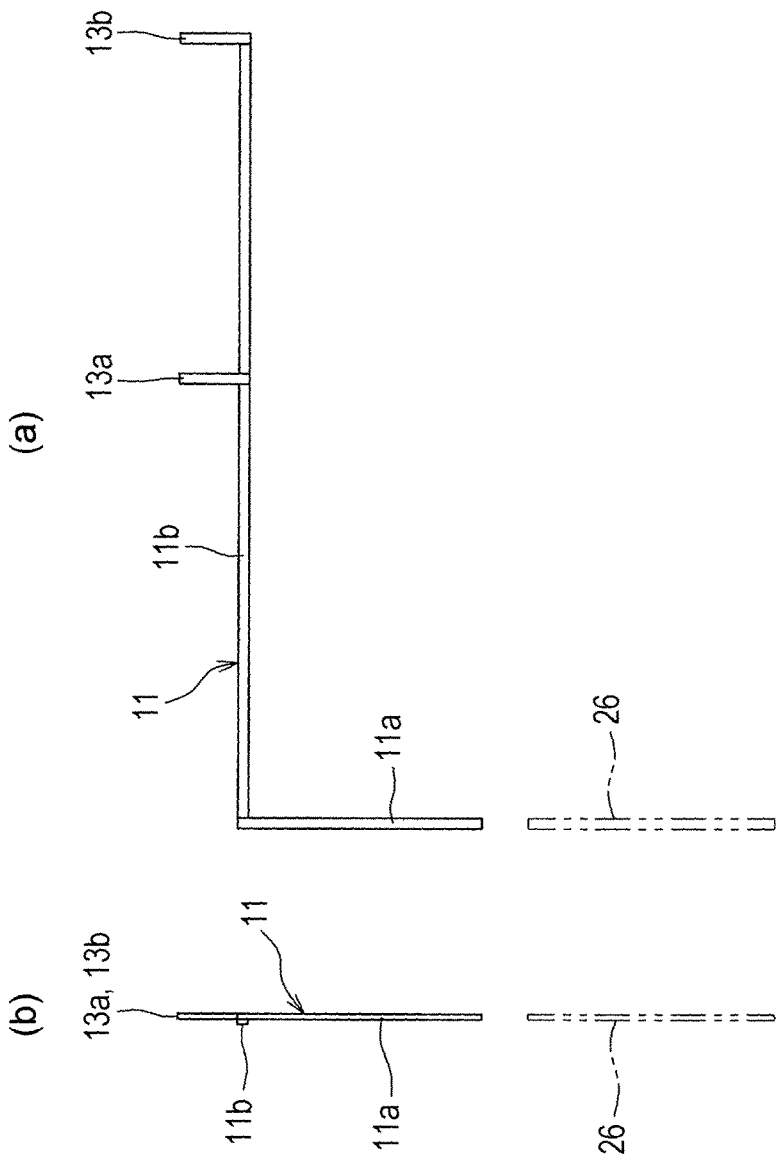
FIG. 7(a) is a rear view illustrating a positive electrode bus bar and an auxiliary bar member when viewed from a rear surface side.
FIG. 7(b) is a side view illustrating the positive electrode bus bar and the auxiliary bar member.

Next, the L-shaped positive electrode bus bar 11 and negative electrode bus bar 12 will be described in detail. As is the case with FIG. 2, FIG. 7(a) is a rear view illustrating the positive electrode bus bar 11 when viewed from a rear surface side, and FIG. 7(b) is a side view illustrating the positive electrode bus bar 11. As is clear from FIGS. 7(a) and 7(b), the positive electrode bus bar 11 has a configuration in which one end of a strip-shaped first bar member 11a and one end of a strip-shaped second bar member 11b are connected to each other with soldering and the like, and the first and second bar members 11a and 11b are disposed in an L-shape. In the solar battery module 1, the first bar member 11a is disposed along the vertical side 1b, and the second bar member 11b is disposed along the horizontal side 1c.

In addition, the pair of positive electrode output terminals 13a and 13b are connected to the second bar member 11b with soldering and the like, and the positive electrode output terminals 13a and 13b protrude from the second bar member 11b in a direction opposite to a direction of the first bar member 11a.

In addition, in FIGS. 7(a) and 7(b), an auxiliary bar member 26 that is used in combination with the negative electrode bus bar 12 is also shown. The auxiliary bar member 26 is disposed on an extension of the first bar member 11a of the positive electrode bus bar 11, and is separated from the first bar member 11a.

Figure 8:
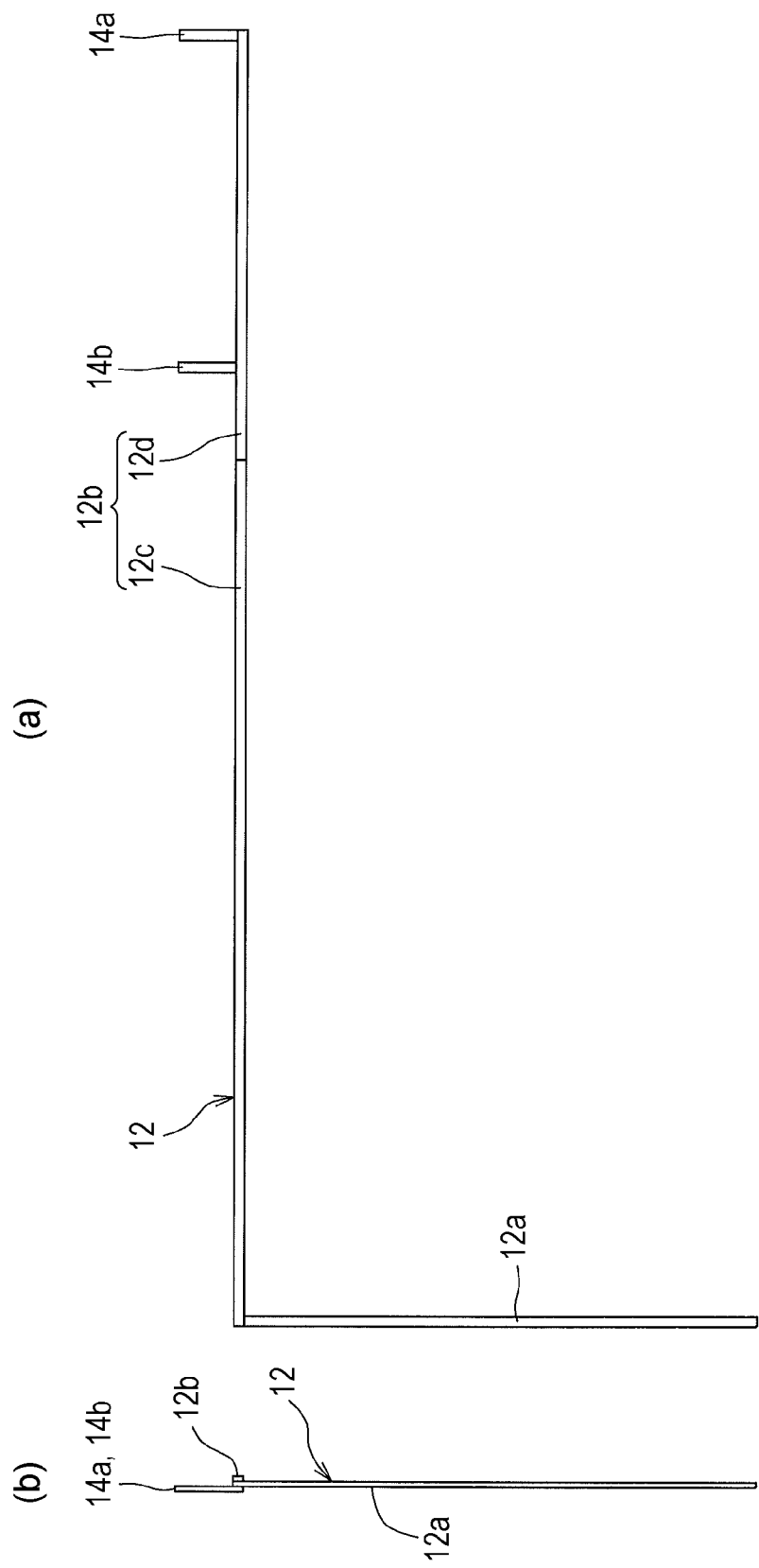
FIG. 8(a) is a rear view illustrating a negative electrode bus bar when viewed from a rear surface side.
FIG. 8(b) is a side view illustrating the negative electrode bus bar.

As is the case with FIG. 2, FIG. 8(a) is a rear view illustrating the negative electrode bus bar 12 when viewed from a rear side, and FIG. 8(b) is a side view illustrating the negative electrode bus bar 12. As is clear from FIGS. 8(a) and 8(b), the negative electrode bus bar 12 has a configuration in which one end of a strip-shaped first bar member 12a and one end of a strip-shaped second bar member 12b are connected to each other with soldering and the like, and the first and second bar members 12a and 12b are disposed in an L-shape. In addition, the second bar member 12b is joined by connecting two bar members 12c and 12d with soldering and the like. In the solar battery module 1, the first bar member 12a is disposed along the vertical side 1b, and the second bar member 12b is disposed along the horizontal side 1c.

In addition, the pair of negative electrode output terminals 14a and 14b are connected to the bar member 12d on a front end side of the second bar member 12b with soldering and the like, and the negative electrode output terminals 14a and 14b protrude from the bar member 12d in a direction opposite to a direction of the first bar member 12a.

For example, the positive electrode bus bar 11, the negative electrode bus bar 12, the positive electrode output terminals 13a and 13b, the negative electrode output terminals 14a and 14b, and the auxiliary bar member 26 have a configuration in which solder plating is performed on a surface of a strip-shaped copper material, and have the same thickness and width as each other.

Figure 9:
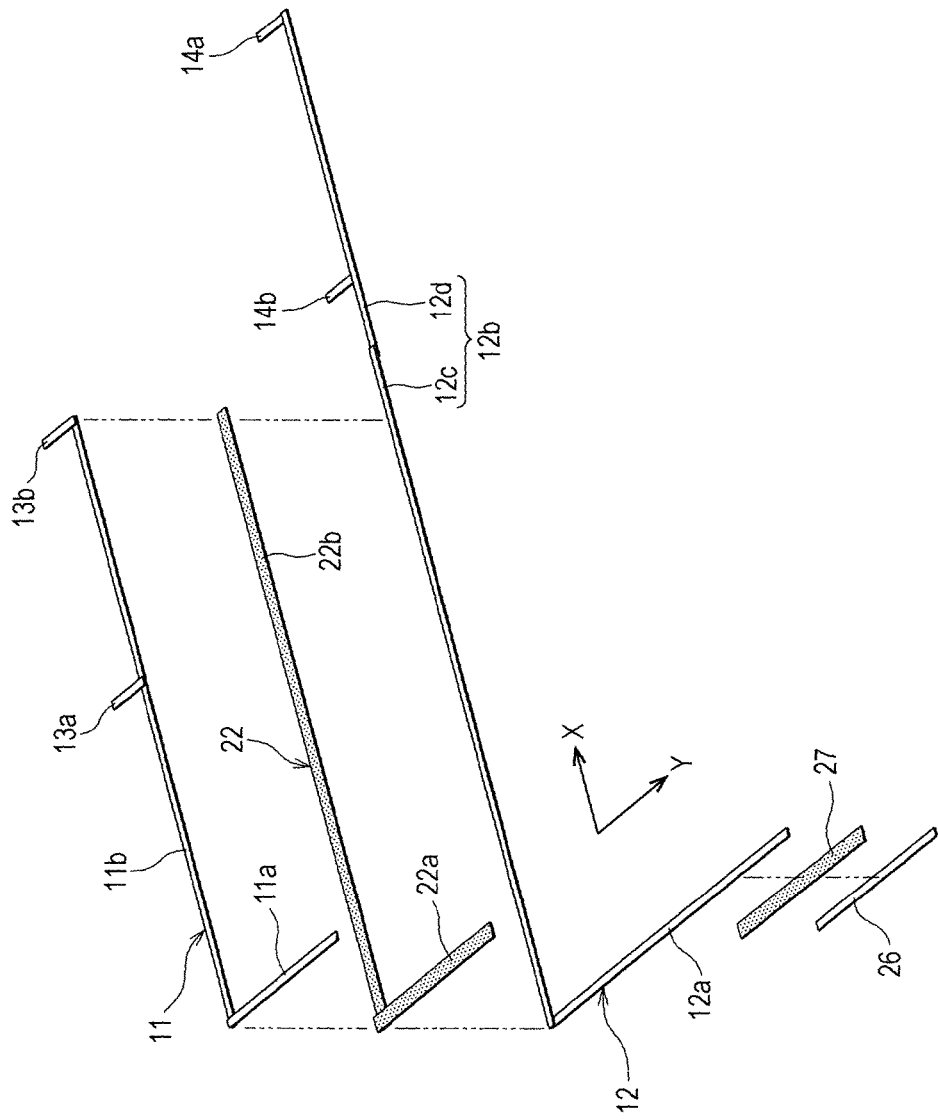
FIG. 9 is an exploded perspective view illustrating the positive electrode bus bar, the negative electrode bus bar, an insulating member, and the auxiliary bar member.

FIG. 9 is an exploded perspective view illustrating the positive electrode bus bar 11, the negative electrode bus bar 12, the auxiliary bar member 26, and an insulating member 22 that is interposed between the bus bars 11 and 12, and an insulating member 27 that is interposed between the auxiliary bar member 26 and the negative electrode bus bar 12. As shown in FIG. 9, the positive electrode bus bar 11 and the negative electrode bus bar 12 overlap each other through the insulating member 22, and the bus bars 11 and 12 are insulated by the insulating member 22. In the solar battery module 1, the negative electrode bus bar 12, the insulating member 22, and the positive electrode bus bar 11 overlap each other in a direction perpendicular to the light-receiving surfaces of the solar battery cells 3.

In addition, the insulating member 27 and the auxiliary bar member 26 overlap an approximately half on a front end side of the first bar member 12a of the negative electrode bus bar 12 on a side (a lower side in FIG. 9) opposite to the positive electrode bus bar 11. The auxiliary bar member 26 and the first bar member 12a are insulated from each other by the insulating member 27.

The insulating member 22 has a configuration in which a strip-shaped first insulating member 22a and a strip-shaped second insulating member 22b are disposed in an L-shape, and an L-shaped corner of the insulating member 22 overlaps L-shaped corners of the bus bars 11 and 12. In addition, the first insulating member 22a is slightly longer than the first bar member 11a of the positive electrode bus bar 11 in the vertical direction Y, and is interposed between the entirety of the first bar member 11a and a part (a portion that overlaps at least the first bar member 11a) of the first bar member 12a of the negative electrode bus bar 12 to insulate the first bar member 11a and the first bar member 12a. In addition, the second insulating member 22b is slightly longer than the second bar member 11b of the positive electrode bus bar 11 in the horizontal direction X, and is interposed between the entirety of the second bar member 11b and a part (a portion that overlaps at least the second bar member 11b) of the second bar member 12b of the negative electrode bus bar 12 to insulate the second bar member 11b and the second bar member 12b.

In addition, the insulating member 27 is slightly longer than the auxiliary bar member 26 in the vertical direction Y, and is interposed between the entirety of the auxiliary bar member 26 and a portion (a portion that overlaps at least the auxiliary bar member 26) on a front end side of the first bar member 12a of the negative electrode bus bar 12 to insulate the auxiliary bar member 26 and the first bar member 12a.

The insulating member 22 (first and second insulating members 22a and 22b) has an adhesive layer on both surfaces thereof, and is bonded to any of the positive electrode bus bar 11 and the negative electrode bus bar 12 to integrally hold the bus bars 11 and 12. Similarly, the insulating member 27 has an adhesive layer on both surfaces thereof, and is bonded to both of the first bar member 12a of the negative electrode bus bar 12 and the auxiliary bar member 26 to integrally hold the first bar member 12a and the auxiliary bar member 26. Accordingly, the positive electrode bus bar 11, the negative electrode bus bar 12, and the auxiliary bar member 26 are insulated and are integrally held by the insulating members 22 and 27.

For example, the insulating members 22 and 27 have a configuration in which an epoxy-based adhesive layer having a thickness of 25 μm is formed on both surfaces of a polyimide film having a thickness of 30 μm, and the entire thickness is approximately 85 μm. Since the epoxy-based adhesive layer having an excellent insulation property is applied as the adhesive layer, even when the polyimide film is not particularly thick, it is possible to sufficiently raise the insulation property of the insulating members 22 and 27, and thus it is possible to reduce the cost thereof.

Figure 10:
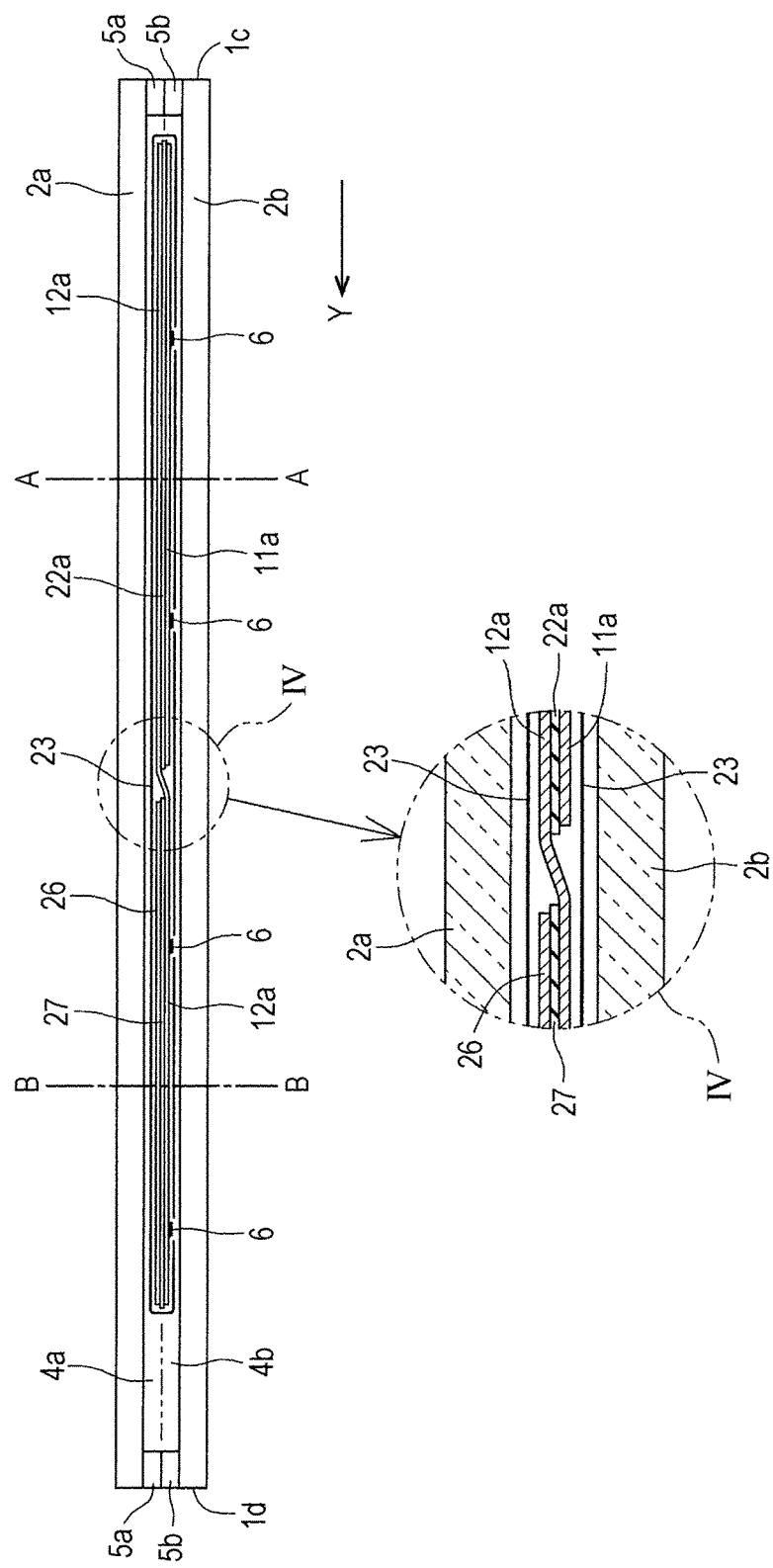
FIG. 10 is a cross-sectional view illustrating a first bar member of the positive electrode bus bar, a first bar member of the negative electrode bus bar, the auxiliary bar member, and the like by cutting these members along a vertical direction in combination with an enlarged view illustrating a portion IV in the cross-sectional view.

FIG. 10 is a cross-sectional view illustrating the first bar member 11a of the positive electrode bus bar 11, the first bar member 12a of the negative electrode bus bar 12, the auxiliary bar member 26, and the like by cutting these members along the vertical direction Y in combination with an enlarged view illustrating a portion IV in the cross-sectional view. As shown in FIG. 10, in the first bar member 12a of the negative electrode bus bar 12, an approximately half on an L-shaped corner side overlaps the first bar member 11a of the positive electrode bus bar 11 through the first insulating member 22a, and an approximately half on a front end side overlaps the auxiliary bar member 26 through the insulating member 27. In addition, in the portion that overlaps the first bar member 11a, the first bar member 12a is positioned in the vicinity of the light-receiving surface glass plate 2a in comparison to the first bar member 11a, and in the portion that overlaps the auxiliary bar member 26, the first bar member 12a is positioned in the nearer vicinity of the rear surface glass plate 2b in comparison to the auxiliary bar member 26.

Figure 11:
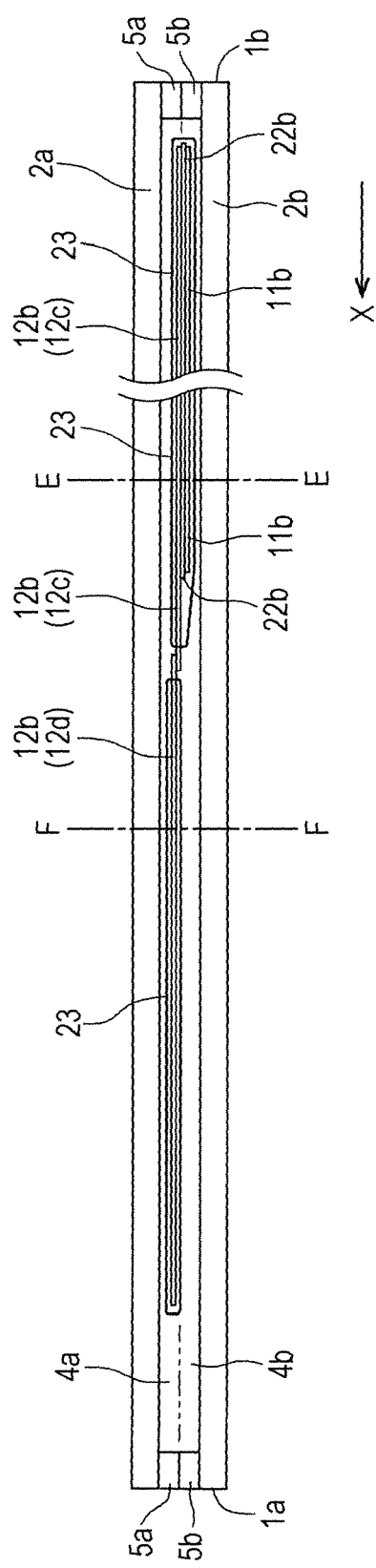
FIG. 11 is a cross-sectional view illustrating a second bar member of the positive electrode bus bar, a second bar member of the negative electrode bus bar, and the like by cutting these members along a horizontal direction.

FIG. 11 is a cross-sectional view illustrating the second bar member 11b of the positive electrode bus bar 11, the second bar member 12b of the negative electrode bus bar 12, and the like by cutting these members along the horizontal direction X. As shown in FIG. 11, in the second bar member 12b of the negative electrode bus bar 12, an approximately half (bar member 12c) on an L-shaped corner side overlaps the second bar member 11b of the positive electrode bus bar 11 through the second insulating member 22b, and an approximately half (bar member 12d) on a front end side does not overlap any of the second insulating member 22b and the second bar member 11b. In addition, in the portion that overlaps the second bar member 11b, the second bar member 12b (bar member 12c) is positioned in the nearer vicinity of the light-receiving surface glass plate 2a in comparison to the second bar member 11b.

Figure 12:
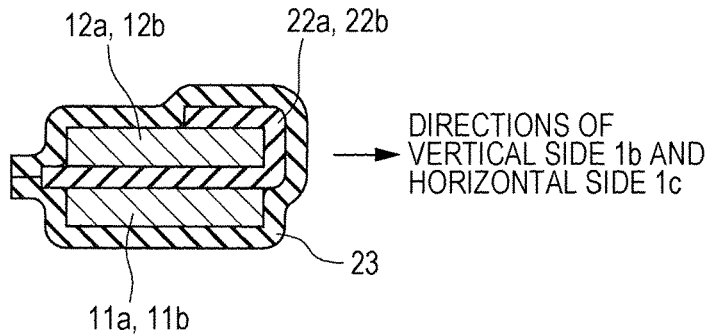
FIG. 12 is a cross-sectional view illustrating a portion, at which the positive electrode bus bar and the negative electrode bus bar overlap each other, in an enlarged manner.

FIG. 12 is a cross-sectional view illustrating a portion, at which the positive electrode bus bar 11 and the negative electrode bus bar 12 overlap each other, in an enlarged manner (cross-sectional view taken along line A-A of FIGS. 1 and 10, and line E-E of FIGS. 1 and 11).

As shown in FIG. 12, the width of the first and second insulating members 22a and 22b is larger than the width of the first and second bar members 11a and 11b of the positive electrode bus bar 11, and the width of the first and second bar members 12a and 12b of the negative electrode bus bar 12.

In addition, the first insulating member 22a protrudes from ends on both sides of the first bar members 11a and 12a, and a portion of the first insulating member 22a, which relatively further protrudes from ends on one side of the first bar members 11a and 12a that face the direction of the vertical side 1b, is folded back to one surface of the first bar member 12a and is bonded thereto. Accordingly, a positional deviation is less likely to occur between the first bar members 11a and 12a and the first insulating member 22a. In addition, even when a positional deviation of a certain degree like an error occurs, the first bar members 11a and 12a are reliably insulated by the first insulating member 22a.

Similarly, the second insulating member 22b protrudes from ends on both sides of the second bar members 11b and 12b, and a portion of the second insulating member 22b, which relatively further protrudes from ends on one side of the second bar members 11b and 12b that face a direction of the horizontal side 1c, is folded back to one surface of the second bar member 12b and is bonded thereto. Accordingly, a positional deviation is less likely to occur between the second bar members 11b and 12b and the second insulating member 22b. In addition, even when a positional deviation of a certain degree like an error occurs, the second bar members 11b and 12b are reliably insulated by the second insulating member 22b.

In addition, the positive electrode bus bar 11 and the negative electrode bus bar 12 are coated with an insulating coating resin 23. For example, the insulating coating resin 23 has a configuration in which an adhesive layer having a thickness of 10 μm is formed on one surface of a polyethylene terephthalate (PET) film having a thickness of 50 μm.

The insulating coating resin 23 coats the entirety of the positive electrode bus bar 11 and a portion of the negative electrode bus bar 12 excluding a connection portion between the bar members 12c and 12d (approximately the entirety of the negative electrode bus bar 12).

Figure 13:
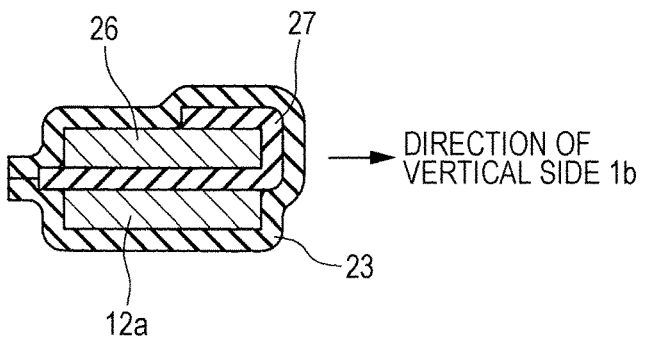
FIG. 13 is a cross-sectional view illustrating a portion, at which the negative electrode bus bar and the auxiliary bar member overlap each other, in an enlarged manner.

FIG. 13 is a cross-sectional view illustrating a portion, at which the negative electrode bus bar 12 and the auxiliary bar member 26 overlap each other, in an enlarged manner (cross-sectional view taken along line B-B of FIGS. 1 and 10). As shown in FIG. 13, the width of the insulating member 27 is set to be larger than the width of the first bar member 12a of the negative electrode bus bar 12 and the auxiliary bar member 26. In addition, the insulating member 27 protrudes from ends on both sides of the first bar member 12a and the auxiliary bar member 26, and a portion of the insulating member 27, which relatively further protrudes from ends on one side of the first bar member 12a and the auxiliary bar member 26 which faces a direction of the vertical side 1b, is folded back to one surface of the auxiliary bar member 26 and is bonded thereto. According to this, a positional deviation is less likely to occur between the first bar member 12a and the auxiliary bar member 26. In addition, even when a positional deviation of a certain degree like an error occurs, the first bar member 12a and the auxiliary bar member 26 are reliably insulated by the insulating member 27.

In addition, the first bar member 12a and the auxiliary bar member 26 are coated with the insulating coating resin 23.

Figure 14:
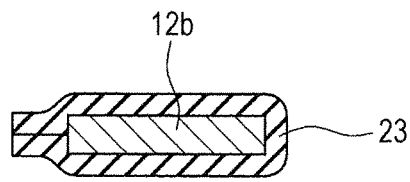
FIG. 14 is a cross-sectional view illustrating a portion of the negative electrode bus bar, which does not overlap any of the insulating member and the positive electrode bus bar, in an enlarged manner.

FIG. 14 is a cross-sectional view illustrating an approximately half (bar member 12d) on a front end side of the second bar member 12b of the negative electrode bus bar 12, which does not overlap any of the second insulating member 22b and the second bar member 11b of the positive electrode bus bar 11, in an enlarged manner (cross-sectional view taken along line F-F in FIGS. 1 and 11). As shown in FIG. 14, at the approximately half (bar member 12d) on a front end side of the second bar member 12b, the second insulating member 22b does not exist, and the bar member 12d is coated with the insulating coating resin 23.

In addition, as shown in FIGS. 1, 2, and 5, portions of the positive electrode output terminals 13a and 13b excluding front ends, and portions of the negative electrode output terminals 14a and 14b excluding front ends are coated with the insulating coating resin 23. The front ends are not coated to connect the front end of the positive electrode output terminal 13a to the positive electrode cable 18 with soldering and the like on an inner side of the positive electrode box 15, to connect the front end of the negative electrode output terminals 14a to the negative electrode cable 19 with soldering and the like on an inner side of the negative electrode box 16, and to connect the front end of the positive electrode output terminal 13b and the front end of the negative electrode output terminal 14b to both terminals of the bypass diode 21 with soldering and the like on an inner side of the diode box 17.

As shown in FIG. 5, it is preferable that a coating range of coating the output terminals 13a, 13b, 14a, and 14b with the insulating coating resin 23 extend from outer end surfaces of the double-sided adhesive tapes 5a and 5b to the outside. In this embodiment, a range of coating with the insulating coating resin 23 extends from the outer end surface to the outside by approximately 3 mm. The outer end surfaces of the double-sided adhesive tapes 5a and 5b represent end surfaces which perpendicularly intersect the front surface or the rear surface of the light-receiving surface glass plate 2a and the rear surface glass plate 2b, and which face a direction opposite to the sealing resins 4a and 4b.

As described above, when the insulating coating resin 23 is formed to extend from the outer end surface of the double-sided adhesive tapes 5a and 5b to the outside, it is possible to further improve weather resistance of the solar battery module 1. Here, the improvement of the weather resistance will be described by comparing two comparative examples and this embodiment. First, in a first comparative example, the output terminals 13a, 13b, 14a, and 14b are not coated with the insulating coating resin 23, and the output terminals 13a, 13b, 14a, and 14b are brought into direct contact with the double-sided adhesive tapes 5a and 5b or the sealing resins 4a and 4b. As a result, parts of the sealing resins 4a and 4b which come into contact with or are close to the output terminals 13a, 13b, 14a, and 14b turn yellow or become discolored over a long period of time. In addition, in a second comparative example, a part of each of the output terminals 13a, 13b, 14a, and 14b is coated with the insulating coating resin 23, and a range of coating with the insulating coating resin 23 is set as up to a position between the double-sided adhesive tapes 5a and 5b to be shorter than that of this embodiment. However, there is a tendency that a part of each of the sealing resins 4a and 4b, which comes into contact with or is close to the output terminals 13a, 13b, 14a, and 14b, to turns yellow or become discolored. In contrast, in this embodiment, the range of coating with the insulating coating resin 23 extends from the outer end surfaces of the double-sided adhesive tapes 5a and 5b to the outside by approximately 3 mm. Accordingly, it is confirmed that even after elapse of a long period of time in the vicinity of the output terminals 13a, 13b, 14a, and 14b, the sealing resins 4a and 4b do not turn yellow or become discolored, and the weather resistance is apparently improved. Here, it is assumed that the turning yellow or discoloring of the sealing resins 4a and 4b occurs due to oxidation of the sealing resins 4a and 4b by oxygen contained in moisture that intrudes into the output terminals 13a, 13b, 14a, and 14b along surfaces thereof.

Figure 15:
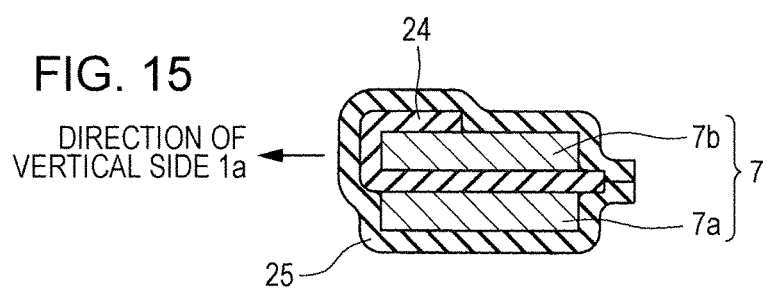
FIG. 15 is a cross-sectional view illustrating a connection bus bar in an enlarged manner.

Next, the connection bus bar 7 will be described. FIG. 15 is a cross-sectional view illustrating the connection bus bar 7 in an enlarged manner. As shown in FIG. 15, the connection bus bar 7 includes a strip-shaped first bar member 7a and a strip-shaped second bar member 7b, and the first and second bar members 7a and 7b overlap each other through an insulating member 24. In the solar battery module 1, the first and second bar members 7a and 7b overlap each other in a direction in which the insulating member 24 perpendicularly intersects the light-receiving surfaces of the solar battery cells 3.

For example, the first and second bar members 7a and 7b have a configuration in which solder plating is performed on a surface of a strip-shaped copper material, and have the same length, thickness, and width as each other. As is the case with the insulating member 22, the insulating member 24 is a strip-shaped member, and for example, the insulating member 24 is constituted by forming an epoxy-based adhesive layer having a thickness of 30 μm on both surfaces of a polyimide film having a thickness of 25 μm, and the first bar member 7a and the second bar member 7b are bonded to both surfaces and are held thereto.

In addition, the width of the insulating member 24 is set to be larger than that of the first and second bar members 7a and 7b. In addition, the insulating member 24 protrudes from ends on both sides of the first and second bar members 7a and 7b, and a portion of the insulating member 24, which relatively further protrudes from ends on one side of the first and second bar members 7a and 7b that face a direction of the vertical side 1a, is folded back to one surface of the second bar member 7b and is bonded thereto. According to this, a positional deviation is less likely to occur between the first and second bar members 7a and 7b, and the insulating member 24. In addition, even when a positional deviation of a certain degree like an error occurs the first and second bar members 7a and 7b are reliably insulated by the insulating member 24.

In addition, the first and second bar members 7a and 7b are coated with an insulating coating resin 25. As is the case with the insulating coating resin 23, the insulating coating resin 25 has a configuration in which an adhesive layer having a thickness of 10 μm is formed on one surface of a polyethylene terephthalate (PET) film having a thickness of 50 μm. According to this, an insulation property of the first and second bar members 7a and 7b is further raised.

In addition, all of the positive electrode bus bar 11, the negative electrode bus bar 12, the positive electrode output terminals 13a and 13b, the negative electrode output terminal 14a and 14b, the connection bus bar 7, and the auxiliary bar member 26 have a configuration in which solder plating is performed on a surface of a strip-shaped copper material, and thus a deviation in glossiness exists on surfaces thereof, and thus this deviation may become a cause of deterioration in a design property of the solar battery module 1. However, the majority of the bus bars 7, 11, 12, the output terminals 13a, 13b, 14a, and 14b, and the auxiliary bar member 26 is coated with the insulating coating resins 23 and 25, deviation in glossiness on the surfaces cannot be visually recognized, and thus the design property of the solar battery module 1 is not damaged.

In addition, in a case where a black PET film is applied as the insulating coating resins 23 and 25, the color of the insulating coating resins 23 and 25 becomes close to the color of the solar battery cells 3, and thus it is possible to obtain an external appearance of the solar battery module 1 which gives a sense of uniformity. In addition to black a PET film, PET films with other colors may be applied, and a transparent PET film may be applied.

Next, a sequence of manufacturing the solar battery module 1 of this embodiment will be sequentially described by dividing the sequence into a preliminary process, a mounting process, and a sealing process. First, in the preliminary process, two solar battery strings, which are constituted by connecting a plurality of solar battery cells 3 in series through interconnectors 6, are prepared. In addition, the positive electrode bus bar 11 and the negative electrode bus bar 12 are made to overlap each other through the insulating member 22, the first bar member 12a of the negative electrode bus bar 12 and the auxiliary bar member 26 are made to overlap each other through the insulating member 27, and the positive electrode bus bar 11, the negative electrode bus bar 12, the auxiliary bar member 26, and the like are coated with the insulating coating resin 23. In addition, the first and second bar members 7a and 7b of the connection bus bar 7 are made to overlap each other through the insulating member 24, and the connection bus bar 7 and the like is coated with the insulating coating resin 25.

Next, in the mounting process, the light-receiving surface glass plate 2a is horizontally supported, and the sealing resin 4a is mounted on the light-receiving surface glass plate 2a to overlap therewith. A vertical width and a horizontal width of the sealing resin 4a are set to be smaller than those of the light-receiving surface glass plate 2a by two times a width of the double-sided adhesive tapes 5a and 5b, and the sealing resin 4a is disposed on an inner side than sides of the light-receiving surface glass plate 2a by the width of the double-sided adhesive tapes 5a and 5b.

In addition, on the sealing resin 4a, two solar battery strings, which are constituted by connecting a plurality of solar battery cells 3 in series, are disposed in first and second rows R1 and R2, the positive electrode bus bar 11, the negative electrode bus bar 12, and the auxiliary bar member 26 which are coated with the insulating coating resin 23 are disposed, and the connection bus bar 7 coated with the insulating coating resin 25 is disposed. At this time, two L-shaped positive electrode bus bar 11 and negative electrode bus bar 12 are disposed in the vicinity of ends on the other side of the first and second rows R1 and R2 along another vertical side 1b and a horizontal side 1c of the solar battery module 1, and the connection bus bar 7 is disposed in the vicinity of ends on one side of the first and second rows R1 and R2 to be parallel with the vertical side 1a of the solar battery module 1.

Figure 16:
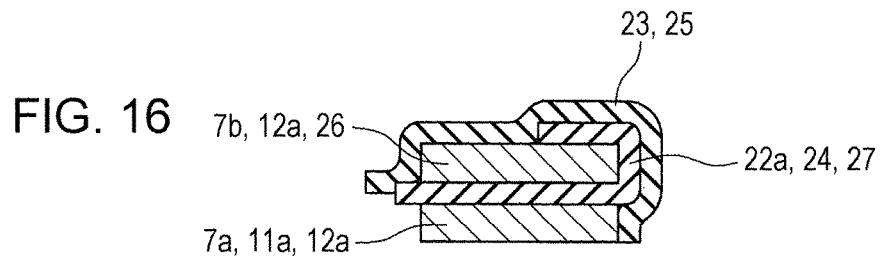
FIG. 16 is a cross-sectional view illustrating a state, in which an insulating coating resin that coats the positive electrode bus bar, the negative electrode bus bar, and the connection bus bar is cut out, in an enlarged manner.

Subsequently, as shown in FIG. 16, the insulating coating resin 25 that coats the first bar member 7a of the connection bus bar 7 is cut out at four connection portions with four interconnectors 6 that protrude from the solar battery cells 3 on the ends on one side of the first and second rows R1 and R2 to expose a soldering surface of the first bar member 7a, and the interconnectors 6 are soldered to the soldering surface of the four connection portions of the first bar member 7a. At this time, the first bar member 7a is heated by the soldering. However, the connection bus bar 7 has a three-layer structure constituted by the first and second bar members 7a and 7b, and the insulating member 24, and thus heat of the first bar member 7a is conducted and dispersed to the second bar member 7b and the insulating member 24. Accordingly, a temperature of the first bar member 7a is rapidly lowered. Accordingly, the insulating coating resin 25 or the sealing resin 4a is not heated and melted by the heat of the first bar member 7a. In addition, since the insulating coating resin 25 that coats the second bar member 7b and the sealing resin 4a is not heated and melted, the design property of the solar battery module 1 when viewed from a side surface of the light-receiving surface glass plate 2a is not damaged.

In addition, as shown in FIG. 16, the insulating coating resin 23 that coats the first bar member 11a of the positive electrode bus bar 11 is cut out at two connection portions with two interconnectors 6 that protrude from positive electrodes of the solar battery cell 3 on the other end of the first row R1 to expose a soldering surface of the first bar member 11a, and the interconnectors 6 are soldered to the soldering surfaces of the two connection portions of the first bar member 11a. Also in this case, heat of the first bar member 11a due to the soldering is conducted and dispersed to the first bar member 12a of the negative electrode bus bar 12 and the first insulating member 22a, and thus a temperature of the first bar member 11a is rapidly lowered. Accordingly, the insulating coating resin 23 or the sealing resin 4a is not heated and melted due to the heat of the first bar member 11a, and thus the design property of the solar battery module 1 when viewed from a side surface of the light-receiving surface glass plate 2a is not damaged.

In addition, as shown in FIG. 16, the insulating coating resin 23 that coats the first bar member 12a of the negative electrode bus bar 12 is cut out at two connection portions with two interconnectors 6 that protrude from negative electrodes of the solar battery cell 3 on the other end of the second row R2 to expose a soldering surface of the first bar member 12a, and the interconnectors 6 are soldered to the soldering surfaces at the two connection portions of the first bar member 12a. Also in this case, heat of the first bar member 12a due to soldering is conducted and dispersed to the auxiliary bar member 26 and the insulating member 27, and thus a temperature of the first bar member 12a is rapidly lowered. Accordingly, the insulating coating resin 23 or the sealing resin 4a is not heated and melted by the heat of the first bar member 12a, and the design property of the solar battery module 1 when viewed from a side surface of the light-receiving surface glass plate 2a is not damaged. However, the cutting working of the insulating coating resins 23 and 25 may be performed in the preliminary process.

Figure 17:
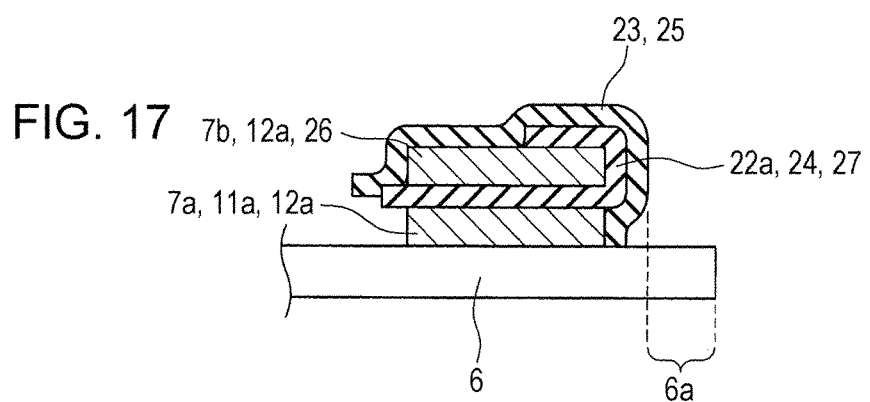
FIG. 17 is a cross-sectional view illustrating an interconnector, which is connected to the bus bar, in an enlarged manner.

After the interconnectors 6 are soldered to the first bar members 7a, 11a, and 12a, respectively, as shown in FIG. 17, protrusion portions 6a of the interconnectors 6a that protrude from ends on one side of the first bar members 7a, 11a, and 12a are cut out by using a tool such as a nipper. At this time, the tool approaches the first insulating member 22a, the insulating member 24, or the insulating member 27, but the first insulating member 22a, the insulating member 24, or the insulating member 27 is folded back at one end on one side, and thus the first insulating member 22a, the insulating member 24, or the insulating member 27 is not cut out by the tool. Accordingly, contact or short-circuit between the first bar member 11a of the positive electrode bus bar 11 and the first bar member 12a of the negative electrode bus bar 12, contact or short-circuit between the first bar member 7a and the second bar member 7b of the connection bus bar 7, or contact or short-circuit between the auxiliary bar member 26 and the first bar member 12a, which is caused by the cutting-out, does not occur.

It is necessary for the contact or short-circuit between the first bar member 11a of the positive electrode bus bar 11 and the first bar member 12a of the negative electrode bus bar 12 not to occur, but the contact or short-circuit between the first bar member 7a and the second bar member 7b of the connection bus bar 7, or the contact or short-circuit between the auxiliary bar member 26 and the first bar member 12a does not become a matter of concern.

Subsequently the double-sided adhesive tape 5a is bonded to an end of the light-receiving surface glass plate 2a. The sealing resin 4a is disposed on an inner side than the sides of the light-receiving surface glass plate 2a by the width of the double-sided adhesive tapes 5a and 5b, and thus the double-sided adhesive tape 5a can be bonded to the end of the light-receiving surface glass plate 2a. At this time, the double-sided adhesive tape 5a is interposed between the positive electrode output terminals 13a and 13b and the end of the light-receiving surface glass plate 2a, and the double-sided adhesive tape 5a is interposed between the negative electrode output terminals 14a and 14b and the end of the light-receiving surface glass plate 2a, and front ends of the positive electrode output terminals 13a and 13b, and front ends of the negative electrode output terminals 14a and 14b are made to protrude to the outside of the light-receiving surface glass plate 2a.

In addition, the double-sided adhesive tapes 5b is bonded to the double-sided adhesive tape 5a to overlap therewith, the double-sided adhesive tapes 5a and 5b are provided to the end of the light-receiving surface glass plate 2a, and the front ends of the positive electrode output terminals 13a and 13b and the front ends of the negative electrode output terminals 14a and 14b are made to protrude to the outside of the light-receiving surface glass plate 2a through between the double-sided adhesive tapes 5a and 5b.

In addition, the sealing resin 4b is overlapped. The sealing resin 4b has the same size as the sealing resin 4a, and is disposed on an inner side than the sides of the light-receiving surface glass plate 2a by the width of the double-sided adhesive tapes 5a and 5b. Accordingly, the double-sided adhesive tape 5b is exposed without being covered with the sealing resin 4b. In addition, the rear surface glass plate 2b is mounted on the sealing resin 4b and the double-sided adhesive tape 5b to overlap therewith, and the end of the rear surface glass plate 2b is bonded to the double-sided adhesive tape 5b. According to this, the solar battery cells 3, the sealing resins 4a and 4b, the connection bus bar 7, the positive electrode bus bar 11, the negative electrode bus bar 12, and the like are interposed between the light-receiving surface glass plate 2a and the rear surface glass plate 2b. In addition, the sealing resins 4a and 4b are surrounded and held by the double-sided adhesive tapes 5a and 5b, and the solar battery cells 3, the connection bus bar 7, the positive electrode bus bar 11, the negative electrode bus bar 12, and the like are interposed and held between the sealing resins 4a and 4b. According to this, even when the solar battery module 1 is transported to perform the subsequent sealing process, a positional deviation does not occur in the sealing resins 4a and 4b, the solar battery cells 3, the bus bars 7, 11, and 12, and the like.

Next, in the sealing process, the solar battery module 1 is sealed by using a laminating apparatus. First, the solar battery module 1 that is processed in the mounting process is mounted on a heater plate in a chamber of the laminating apparatus in such a manner that the light-receiving surface glass plate 2a faces toward a lower side. In addition, the chamber is evacuated, and the heater plate is made to generate heat at a specified temperature to heat the solar battery module 1. This state is maintained for a certain time. According to this, air between the light-receiving surface glass plate 2a and the rear surface glass plate 2b, or air included in the sealing resins 4a and 4b is released to the outside through the double-sided adhesive tapes 5a and 5b on ends of the glass plates 2a and 2b. In addition, the sealing resins 4a and 4b are softened, and thus the solar battery cell 3, the connection bus bar 7, the positive electrode bus bar 11, the negative electrode bus bar 12, and the like are sealed by the sealing resins 4a and 4b. At this time, the double-sided adhesive tapes 5a and 5b prevent the softened sealing resins 4a and 4b from protruding from ends of the glass plates 2a and 2b.

Here, the folded-back portions of the first and second insulating members 22a and 22b, or the insulating members 24 and 27 overlap an end on one side of the positive electrode bus bar 11 that faces the outside of the solar battery module 1 (faces the vertical sides 1a and 1b, and the horizontal side 1c), an end on one side of the negative electrode bus bar 12, an end on one side of the connection bus bar 7, and an end on one side of the auxiliary bar member 26, and become bulky, and thus air between the sealing resins 4a and 4b is less likely to be released. However, in the lighting-type solar battery module 1, it is necessary for the thickness of the sealing resins 4a and 4b to be large so as to prevent fracture of the light-receiving surface glass plate 2a and the rear surface glass plate 2b. Along with this, a heating time and an evacuation time with the laminating apparatus are lengthened in comparison to that of a different kind of solar battery module that is not a lighting type, and thus even in a case where the first and second insulating members 22a and 22b, or the insulating members 24 and 27 are folded back as described above, it is possible to reliably release air.

In this manner, after the solar battery cells 3, the connection bus bar 7, the positive electrode bus bar 11, the negative electrode bus bar 12, and the like are sealed by the sealing resins 4a and 4b, the chamber is returned to atmospheric pressure, and the solar battery module 1 is compressed at 1 atm to improve and stabilize an adhesion state of the sealing resins 4a and 4b. Then, the solar battery module 1 is taken out from the chamber.

In addition, a curing process may be performed. The curing process is a process that is necessary in a case where EVA is applied as the sealing resins 4a and 4b, and is a process of allowing a cross-linking process of the EVA to progress so as to stabilize a sealing state. A heating time may be lengthened in a state in which the solar battery module 1 is mounted on the heater plate of the laminating apparatus, or a heat treating apparatus may be additionally provided.

In the solar battery module 1 in this embodiment, the front ends of the positive electrode output terminals 13a and 13b and the front ends of the negative electrode output terminals 14a and 14b are led out through between the double-sided adhesive tapes 5a and 5b which are interposed between the light-receiving surface glass plate 2a and the rear surface glass plate 2b. However, four holes may be formed on the end of the rear surface glass plate 2b, and the front ends of the positive electrode output terminals 13a and 13b and the front ends of the negative electrode output terminals 14a and 14b may be led out from the holes. In this case, the positive electrode box 15, the negative electrode box 16, and the diode box 17 may be provided on an outer surface of the end of the rear surface glass plate 2b.

Hereinbefore, a preferred embodiment of the invention and a modification example thereof have been described with reference to the attached drawings, but it is needless to say that the invention is not limited to the examples. It should be understood by those skilled in the art that various changes and modifications may be made in a range described in the attached claims. It is understood that the changes and modifications are included in the technical range of the invention.

As is clear from the description of the above-described embodiment, the solar battery module (solar battery module 1) of the invention is a solar battery module in which a plurality of solar battery cells (solar battery cells 3) are connected to each other, and which outputs generated electric power of the solar battery cells through a bus bar (the positive electrode bus bar 11, the negative electrode bus bar 12). The bus bar includes the first bar member (the first bar member 11a, 12a) and the second bar member (the second bar member 11b, 12b) which form an L-shape, the first bar member is disposed along one side (the vertical side 1b) of the solar battery module to be connected to electrodes of the solar battery cells, and the second bar member is disposed along the other side (the horizontal side 1c) of the solar battery module which perpendicularly intersects the one side.

In the invention, the bus bar constituted by the first bar member and the second bar member which forms an L-shape is used, and the first bar member is disposed along one side of the solar battery module to be connected to electrodes of the solar battery cells, and the second bar member is disposed along the other side of the solar battery module which perpendicularly intersects the one side. According to this, generated electric power of the solar battery cells can be output from any of the one side and the other side (a short side and a long side) of the solar battery module, and thus a degree of freedom for a connection configuration of the solar battery cells is raised. As a result, it is possible to realize simplification of the connection configuration.

In addition, in the invention, output terminals (the positive electrode output terminals 13a and 13b, the negative electrode output terminals 14a and 14b), which output generated electric power of the solar battery cells, are connected to the second bar member. In this case, when the second bar member is disposed along the long side of the solar battery module, it is possible to output the generated electric power of the solar battery cells from the long-side side.

In addition, in the invention, as the bus bar, a positive electrode bus bar (the positive electrode bus bar 11) and a negative electrode bus bar (the negative electrode bus bar 12) bar are provided. A first bar member (the first bar member 11a) and a second bar member (the second bar member 11b) of the positive electrode bus bar, and a first bar member (the first bar member 12a) and a second bar member (the second bar member 12b) of the negative electrode bus bar overlap each other through an insulating member (the insulating member 22) in a direction perpendicular to light-receiving surfaces of the solar battery cells. The first bar member of the positive electrode bus bar and the first bar member of the negative electrode bus bar are disposed along one side (the vertical side 1b) of the solar battery module to be connected to a positive electrode of one solar battery cell and negative electrode of another solar battery cell, respectively. The second bar member of the positive electrode bus bar and the second bar member of the negative electrode bus bar are disposed along the other side (the horizontal side 1c) of the solar battery module which perpendicularly intersects the one side. As described above, in a case where the positive electrode bus bar and the negative electrode bus bar overlap each other, an area occupied by the bus bar is reduced, and thus a lighting rate of the solar battery module is improved. The lighting rate represents (an amount of light transmitted through the solar battery module)/(an amount of light incident to the solar battery module).

In addition, in the invention, the output terminals or a bypass diode (the bypass diode 21) is provided to the other side. As described above, in a case where the output terminals and the bypass diode are collectively provided to the other side of the solar battery module, the output terminals and the bypass diode can be easily hidden by a window frame bar and the like.

In addition, in the invention, the insulating member is folded back at a side end of the positive electrode bus bar or a side end of the negative electrode bus bar, and covers the side end. According to this, a positional deviation is less likely to occur between the positive electrode bus bar and the negative electrode bus bar, and the insulating member. In addition, even when a positional deviation of a certain degree like an error occurs, the bus bars are reliably insulated by the insulating member.

In addition, in the invention, the bus bars are coated with an insulating coating resin (the insulating coating resin 23). According to this, an insulation property of the bus bar can be further raised.

In addition, in the invention, the solar battery module includes two sheets of light-transmitting plates (the light-receiving surface glass plate 2a and the rear surface glass plate 2b) between which the solar battery cells are interposed, and two double-sided adhesive tapes (the double-sided adhesive tapes 5a and 5b) that are bonded to ends of the light-transmitting plate to overlap each other. At the other side, output terminals (the positive electrode output terminals 13a and 13b, the negative electrode output terminals 14a and 14b), which are connected to the second bar member, are led out to the outside of the light-transmitting plates from between the double-sided adhesive tapes. As described above, the output terminals are led out from between the double-sided adhesive tapes that are bonded between ends of the light-transmitting plates to overlap each other. Accordingly, it is possible to prevent intrusion of moisture and the like between the light-transmitting plates, and thus durability and reliability of the solar battery module are improved.

In addition, in the invention, an additional bus bar (the connection bus bar 7) that connects the solar battery cells is provided, and the additional bus bar includes two bar members (the first bar member 7a and the second bar member 7b), and the bar members overlap each other through an insulating member (the insulating member 24) in a direction perpendicular to light-receiving surfaces of the solar battery cells. In this case, in a case where interconnections of the solar battery cells are soldered to one bus member, heat of the bus member is conducted and dispersed to another bus member or an insulating member, and thus it is possible to prevent peripheral members (the insulating coating resins 23 and 25, and the sealing resin 4a) of the bus bar from being heated and melted.

<Embodiment 2>

Figure 18:
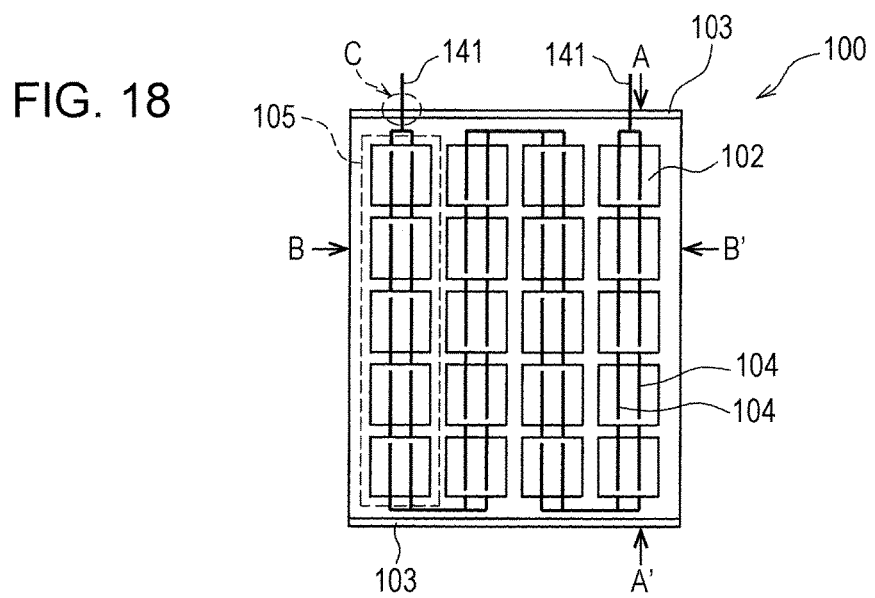
FIG. 18 illustrates Embodiment 2 of the invention, and is a plan view of a solar battery module when viewed from a light-receiving surface side.

FIG. 18 is a plan view illustrating a structure of a solar battery module 100 of this embodiment when viewed from a light-receiving surface side. The light-receiving surface represents a surface on a surface side in which the solar battery cells receive light to convert optical energy to electric power.

To obtain output power sufficient for the solar battery module 100, a plurality of solar battery cells 102 are electrically connected to each other in series by using an internal wire 104 to constitute a solar battery string 105, and a plurality of the solar battery strings 105 are electrically connected to each other.

The solar battery module 100 includes two lead-out electrodes 141 on a positive electrode side and a negative electrode side. Ends on one side of the lead-out electrodes 141 are electrically connected to the solar battery cells, and although not shown in the drawing, ends on the opposite side of the lead-out electrodes are connected to a terminal box.

The solar battery module 100 has a rectangular shape when viewed from the light-receiving surface side, and includes two pairs of opposite ends. A protrusion prevention wall 103 is disposed at a pair of opposite ends of the solar battery module 100 which includes an end from which the lead-out electrodes 141 are led out. The protrusion prevention wall 103 is a substantially elongated rectangular parallelepiped, and has a length for covering an end of the solar battery module. As the solar battery cells 102, a solar battery cell, which uses a substantially rectangular single crystalline silicon substrate having a side length of approximately 156 mm, is used. The thickness of the single crystalline silicon substrate is approximately 200 μm. In this embodiment, the solar battery cell that uses the single crystalline silicon substrate is used, but a solar battery cell, which uses a polycrystalline silicon substrate, may be used.

For lighting, a distance between the solar battery cells is set to approximately 15 mm, and the solar battery cells are disposed in such a manner that a distance between a solar battery cell and an end of the solar battery module becomes approximately 50 mm. It is not necessary for the respective distances to be limited to these numerical values, and the distances can be changed in accordance with a design.

Figure 19:
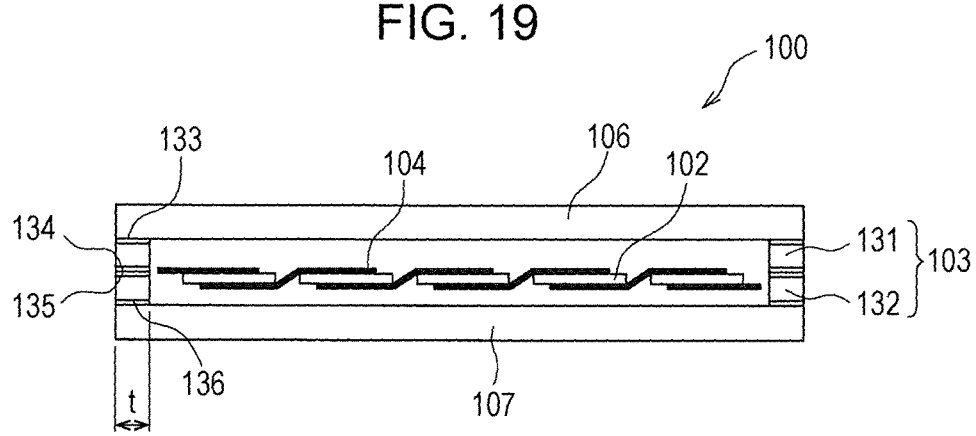
FIG. 19 illustrates Embodiment 2 of the invention, and is a cross-sectional view taken along line A-A' of the solar battery module shown in FIG. 18.
Figure 20:
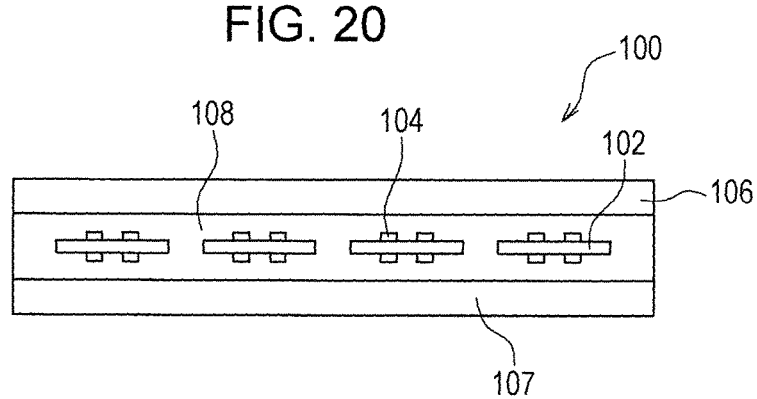
FIG. 20 illustrates Embodiment 2 of the invention, and is a cross-sectional view taken along line B-B' of the solar battery module shown in FIG. 18.
Figure 21:
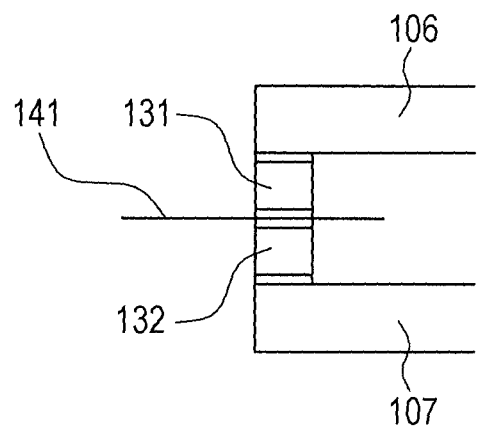
FIG. 21 illustrates Embodiment 2 of the invention, and is an enlarged cross-sectional view of a C portion of the solar battery module shown in FIG. 18.

FIG. 19 is a cross-sectional view taken along line A-A in the solar battery module shown in FIG. 18, FIG. 20 is a cross-sectional view taken along line B-B', and FIG. 21 is an enlarged cross-sectional view of a C site.

As shown in FIG. 19, the solar battery module 100 has a structure in which a plurality of electrically connected solar battery cells 102 are sealed between a light-receiving surface side glass 106 and a non-light-receiving surface side glass 107 with the sealing resin 108. Adjacent solar battery cells 102 are connected to each other in series by the internal wires 104. The protrusion prevention wall 103 is disposed between the light-receiving surface side glass 106 and the non-light-receiving surface side glass 107 at a pair of opposite ends of the solar battery module 100. The protrusion prevention wall 103 has a configuration in which two protrusion prevention walls including a light-receiving surface side protrusion prevention wall 131 and a non-light-receiving surface side protrusion prevention wall 132 are disposed to overlap each other in a thickness direction of the solar battery module 100. As each of the protrusion prevention walls, an acrylic resin foamed body is used. The protrusion prevention wall is not limited to the acrylic resin, and a urethane resin, a silicone resin, and a butyl rubber may be used. In addition, there is no limitation to the foamed body. The light-receiving surface side protrusion prevention wall 131 includes adhesive layers 133 and 134, and the adhesive layer 133 is bonded to a non-light-receiving surface side of the light-receiving surface side glass 106. The non-light-receiving surface side protrusion prevention wall 132 includes adhesive layers 135 and 136, and the adhesive layer 136 is bonded to a light-receiving surface side of the non-light-receiving surface side glass 107. In addition, the adhesive layer 134 is bonded to the adhesive layer 135. When an adhesive layer is provided in the protrusion prevention wall, adhesiveness can be provided between glass and the protrusion prevention wall in comparison to a case in which the adhesive layer is not provided, and thus it is possible to prevent a positional deviation with the protrusion prevention wall.

A width t of the protrusion prevention wall 103 is set to approximately 9 mm. The width t is preferably 5 mm to 10 mm. The protrusion prevention wall has a function of preventing the sealing resin 108 from protruding from an end of the solar battery module during the sealing process. In a case where the width t is less than 5 mm, a sufficient protrusion prevention function is not provided, and thus the width t is preferably 5 mm or more. In addition, a region in which the protrusion prevention wall is provided becomes a region that does not contribute to electric power generation. Therefore, when the width becomes too broad, electric power generation efficiency of the solar battery module does not increase. In addition, in a case of a lighting-type solar battery module, the region in which the protrusion prevention wall is provided becomes a region that does not contribute to lighting, and thus a lighting rate is not raised. Accordingly, it is not preferable to make the width t too large. In addition, the lighting-type solar battery module is frequently used as a window in architecture. In a case where the lighting-type solar battery module is used as a window, it is preferable to hide the protrusion prevention wall present at an end of the solar battery module with a window sash in consideration of a design property. From this reason, it is preferable that the width be 10 mm or less.

As the sealing resin 108, an ethylene vinyl acetate resin (EVA) is used. As the sealing resin, a resin having a high transmittance in a visible light region is preferable. A resin such as an ionomer resin and an olefin resin may be used.

As the light-receiving surface side glass 106 and the non-light-receiving surface side glass 107, tempered glass having a thickness of approximately 4 mm is used. The thickness of the glass is not limited to 4 mm, and heat-strengthened glass, non-tempered glass, and the like may be used.

In addition, as shown in FIG. 20, when viewed from a cross-section along line B-B', the solar battery cells 102 include internal wires 104 on a light-receiving surface side and on a non-light-receiving surface side. The protrusion prevention wall is not disposed at two opposite ends of the solar battery module 100 which are close to an end through which the lead-out electrodes 141 are led out.

In addition, as shown in FIG. 21, each of the lead-out electrodes 141 extends from an end of the solar battery module to the outside of the solar battery module. The lead-out electrode 141 is led out to the outside from between the light-receiving surface side protrusion prevention wall 131 and the non-light-receiving surface side protrusion prevention wall 132. In this structure, it is possible to allow the lead-out electrode 141 to be led out to the outside of the solar battery module approximately in parallel with light-receiving surfaces of the light-receiving surface side glass 106 and the non-light-receiving surface side glass 107. Accordingly, it is possible to prevent the lead-out electrode 141 from being bent at an end of the solar battery module 100, and thus it is possible to prevent a local load from being applied to the lead-out electrode 141. In addition, the lead-out electrode 141 is fixed by the adhesive layer of the protrusion prevention wall 131 and the protrusion prevention wall 132, and thus it is possible to prevent a positional deviation of the lead-out electrode 141 in a direction parallel with the light-receiving surface.

If local bending is present in the lead-out electrode, in a case where repeated temperature changes are applied to the solar battery module, cracking may occur at a bent portion of the lead-out electrode. That is, in a case where the solar battery module, in which local bending is present in the lead-out electrode, is used outdoors for a long period of time, the lead-out electrode may be broken. Since the lead-out electrode is led out to the outside of the solar battery module from between the adjacent protrusion prevention walls, local bending of the lead-out electrode is prevented, and thus it is possible to secure long-term reliability of the solar battery module.

Next, a method of manufacturing the solar battery module of this embodiment will be described.

Figure 22:
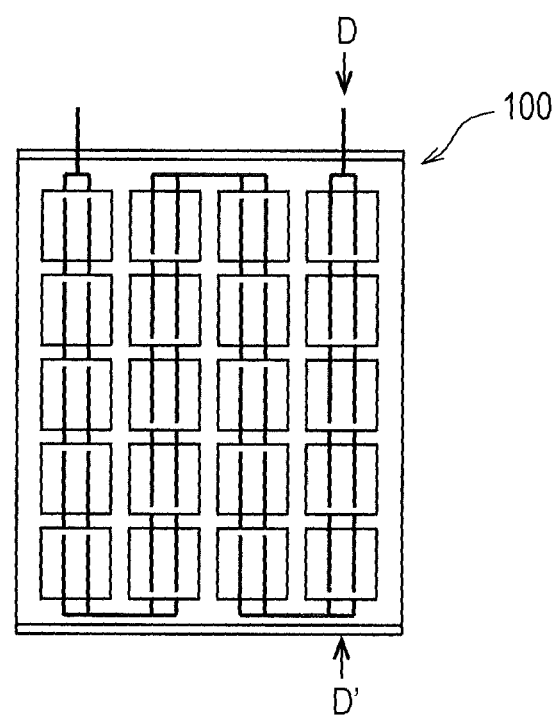
FIG. 22 illustrates Embodiment 2 of the invention, and is a plan view of the solar battery module when viewed from the light-receiving surface side.
Figure 23:
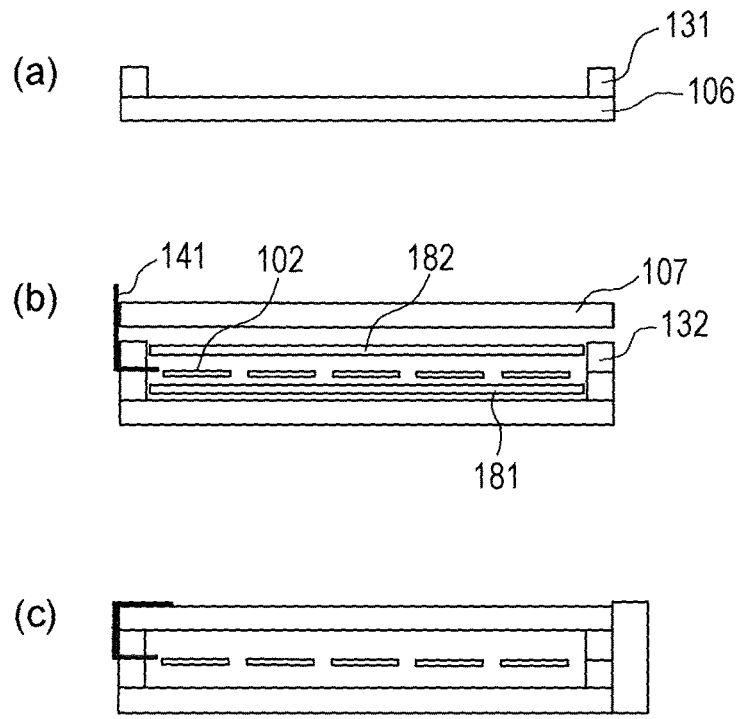
FIG. 23 illustrates Embodiment 2 of the invention, and is a cross-sectional view illustrating a method of manufacturing the solar battery module.

FIG. 22 is a plan view of the solar battery module of this embodiment when viewed from the light-receiving surface side, and FIG. 23 is a cross-sectional view illustrating the method of manufacturing the solar battery module of this embodiment. FIGS. 23(a), 23(b), and 23(c) illustrate a protrusion prevention wall disposing process, a mounting process, and a sealing process, respectively, and correspond to a drawing taken along line D-D' in FIG. 22.

First, a plurality of solar battery cells are electrically connected to the internal wires to form a solar battery string. As the internal wires, a tin-plated copper wire having a thickness of approximately 0.2 mm is used. Soldering is used for connection between the solar battery cell and the internal wire. Conductive paste may be used for the connection. Then, a plurality of solar battery strings are electrically connected to each other. For connection of the plurality of solar battery strings, a connection member having a thickness of approximately 0.2 mm is used.

The protrusion prevention wall disposing process will be described with reference to FIG. 23(a). The light-receiving surface side protrusion prevention wall 131 is mounted on a non-light-receiving surface side of a pair of opposite ends of the light-receiving surface side glass 106. As the light-receiving surface side protrusion prevention wall 131, an acrylic resin foamed body including an adhesive layer is used. The light-receiving surface side protrusion prevention wall 131 includes the adhesive layer, and thus a positional deviation is less likely to occur during mounting on the non-light-receiving surface side of the light-receiving surface side glass 106, and thus it is possible to perform disposition at an accurate position. In addition, it is also possible to prevent occurrence of positional deviation due to movement of the protrusion prevention wall during transport to the subsequent process.

Next, the mounting process is performed. The mounting process will be described with reference to FIG. 23(b).

A sealing resin 181 is disposed between the light-receiving surface side protrusion prevention walls 131 that are disposed on the non-light-receiving surface side of the pair of opposite ends of the light-receiving surface side glass 106. As the sealing resin 181, sheet-shaped EVA is used.

The solar battery cells 102 are disposed on the sealing resin 181 in a state in which the plurality of solar battery strings are electrically connected to each other. At this time, in the lead-out electrodes 141, an end opposite to an end, which is electrically connected to the solar battery cells, is located outside the solar battery module.

Next, the non-light-receiving surface side protrusion prevention wall 132 is disposed on the lead-out electrodes 141. The light-receiving surface side protrusion prevention wall 131 and the non-light-receiving surface side protrusion prevention wall 132 are bonded to each other by adhesive layers 134 and 135, and thus enter a state in which almost no gap is present at the periphery of the lead-out electrodes 141. Since it enters a state in which almost no gap is present due to the adhesive layers, it is possible to prevent the sealing resin from protruding from the periphery of the lead-out electrodes 141.

With regard to an end that is opposite to the ends from which the lead-out electrodes 141 are led out, the non-light-receiving surface side protrusion prevention wall 132 is also disposed on the light-receiving surface side protrusion prevention wall 131.

A sealing resin 182 is disposed on the solar battery cells 102. The protrusion prevention wall is disposed on opposite ends of the light-receiving surface side glass 106, and thus a positional deviation between the sealing resins 181 and 182 is less likely to occur, and thus it is possible to dispose the sealing resin at an accurate position. In addition, the sheet-shaped EVA used as the sealing resin has low adhesiveness with glass before heating, and thus the positional deviation tends to occur after disposition. However, it is also possible to obtain an effect in which the positional deviation after disposition of the sealing resin is less likely to occur due to the protrusion prevention wall.

After disposing the non-light-receiving surface side protrusion prevention wall 132, the non-light-receiving surface side glass 107 is disposed. The protrusion prevention walls 131 and 132 include an adhesive layer, and thus it is possible to temporarily fix the light-receiving surface side glass 106 and the non-light-receiving surface side glass 107 to each other through the protrusion prevention wall. Until now, there has been a problem that a positional deviation has tended to occur between the light-receiving surface side glass and the sealing resin, and between the sealing resin and the non-light-receiving surface side glass during transport of the solar battery module to the subsequent sealing process. However, the protrusion prevention wall with adhesiveness is disposed at opposite ends of the solar battery module, and thus it is possible to prevent the positional deviation during transport.

The lead-out electrodes 141, which are led out to the outside of the solar battery module, are bent along an end surface of the non-light-receiving surface side glass 107, and are also bent along the non-light-receiving surface side of the non-light-receiving surface side glass 107. The bending is performed to prevent a shape of the lead-out electrodes 141 from being deformed when a pressure is applied in the subsequent sealing process. In addition, there is an effect of preventing the lead-out electrodes 141 from being caught by a transport apparatus. The lead-out electrodes 141 may be fixed to the non-light-receiving surface side of the non-light-receiving surface side glass 107 with Teflon (registered trademark) tape and the like. Lead-out positions of the lead-out electrodes 141 become more stable due to the fixing.

The sheet-shaped EVA that is used as the sealing resins 181 and 182 may be one sheet or a plurality of sheets. The number of sheets may be determined in accordance with a design value of a distance between the light-receiving surface side glass 106 and the non-light-receiving surface side glass 107. In a case of sealing solar battery cells using a crystalline silicon substrate, it is necessary to reliably bury the solar battery cells and the internal wires, and thus it is necessary for a distance between the light-receiving surface side glass and the non-light-receiving surface side glass to be larger than in a thin film silicon solar battery.

As the protrusion prevention wall, two protrusion prevention walls including the light-receiving surface side protrusion prevention wall 131 and the non-light-receiving surface side protrusion prevention wall 132 are disposed to overlap each other. The number of the protrusion prevention walls that are disposed to overlap each other is preferably two. This is because the number of manufacturing processes does not increase.

Next, the sealing process will be described with reference to FIG. 23(c). Sealing is performed by compressing the solar battery module while heating the solar battery module by using a laminating apparatus that is a sealing apparatus.

First, the solar battery module mounted in the mounting process is mounted on a heater plate of the laminating apparatus, which is heated to 155° C., in a state in which the light-receiving surface side faces a lower side. Since the thickness of the sealing resin is large, the heating temperature is set to be rather high.

After the mounting, a pressure of an upper chamber and a pressure of a lower chamber of the laminating apparatus are evacuated to be reduced to the same pressure. According to the operation, air is removed from bonding surfaces, and air bubbles included in the sealing resin 108 are removed. The pressure reduction is performed for a long period of time in comparison to a case where the protrusion prevention wall is not disposed. Even when the protrusion prevention wall has been disposed, removal of air from the bonding surfaces and removal of air bubbles included in the sealing resin can be performed. This is assumed to be because the adhesive layer of the protrusion prevention wall has gas permeability. With regard to one protrusion prevention wall that is disposed on one end of the solar battery module, the adhesive layer is composed of two layers including a layer that is bonded to the light-receiving surface side glass 106 and a layer that is bonded to the non-light-receiving surface side glass 107. When protrusion prevention walls are disposed to overlap each other, the number of the adhesive layers increases, and thus it is assumed that the pressure reduction becomes easy.

Then, the upper chamber is returned to the air, and compression is performed at 1 atm. The compression state is maintained to improve adhesiveness between the light-receiving surface side glass 106 and the non-light-receiving surface side glass 107 through the sealing resin 108.

After the sealing process, a curing process may be performed. The curing process is a process that is necessary in a case where EVA is used as the sealing resin, and is a process of allowing a cross-linking reaction of the EVA to progress so as to stabilize a sealing state. The curing process may be performed by a heat treatment apparatus, and a method in which a heating time is lengthened while being mounted on the laminating apparatus may be used.

Figure 24:
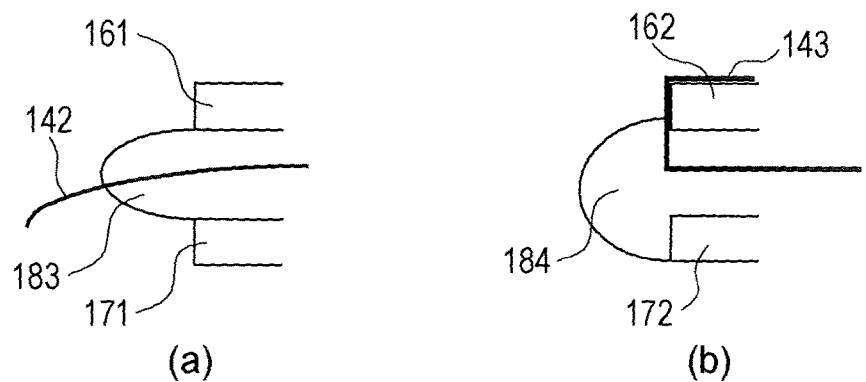
FIG. 24 illustrates Embodiment 2 of the invention, and is a view illustrating Comparative Examples.

Furthermore, samples for comparison are prepared, and confirmation of the effect is performed. FIG. 24 is a view for illustration. FIG. 24 corresponds to an enlarged cross-sectional view of a lead-out portion C of the lead-out electrode in FIG. 18. FIG. 24(*a*) is a view illustrating Comparative Example 1, and FIG. 24(*b*) is a view illustrating Comparative Example 2.

The solar battery module that is prepared by using this embodiment is set as Example, and the samples that are prepared for comparison are set as Comparative Examples 1 and 2. Example and Comparative Example 1 are different from each other in that in Comparative Example 1, the protrusion prevention wall is not disposed in the mounting process, and the lead-out electrode is not bent. Example and Comparative Example 2 are different from each other in that in Comparative Example 2, the protrusion prevention wall is not disposed in the mounting process.

In Comparative Example 1 in which the protrusion prevention wall was not disposed and the sealing process was performed without bending the lead-out electrode, as shown in FIG. 24(*a*), the sealing resin 183 between a light-receiving surface side glass 161 and a non-light-receiving surface side glass 171 protruded from an end of the solar battery module, and was bonded to the periphery of a lead-out electrode 142. It was very difficult to remove the sealing resin that was bonded to the periphery of the lead-out electrode 142. In addition, the lead-out electrode 142 was bent, and thus it was difficult to lead out the lead-out electrode 142 to be parallel with light-receiving surfaces of a light-receiving surface side glass 161 and a non-light-receiving surface side glass 171.

In Comparative Example 2 in which sealing was performed in a state in which the lead-out electrode was bent without disposing the protrusion prevention wall, as shown in FIG. 24(*b*), a sealing resin 184 between a light-receiving surface side glass 162 and a non-light-receiving surface side glass 172 protruded from an end of the solar battery module, and was bonded to the periphery of a lead-out electrode 143 that was bent. As is the case with Comparative Example 1, it was very difficult to remove the sealing resin bonded to the periphery of the lead-out electrode 143. In addition, it was difficult to make the lead-out electrode 143 parallel with light-receiving surfaces of the light-receiving surface side glass 162 and the non-light-receiving surface side glass 172 after removing the sealing resin bonded to the periphery of the lead-out electrode 143.

When comparing Example 1 and Comparative Example 2, it can be seen that when the protrusion prevention wall is provided, it is possible to prevent the sealing resin from being bonded to the periphery of the lead-out electrode, and it is possible to lead out the lead-out electrode to be parallel with the light-receiving surfaces of the light-receiving surface side glass and the non-light-receiving surface side glass.

As another effect obtained by providing the protrusion prevention wall, it is possible to prevent bending from occurring in the solar battery string before and after the sealing process. The reason of this effect is considered to be as follows. If the protrusion prevention wall is provided, when the sealing resin enters a softened state in the sealing process, flowing of the sealing resin occurs inside the solar battery module, and thus it is possible to prevent the position of the solar battery cells from being changed.

Figure 25:
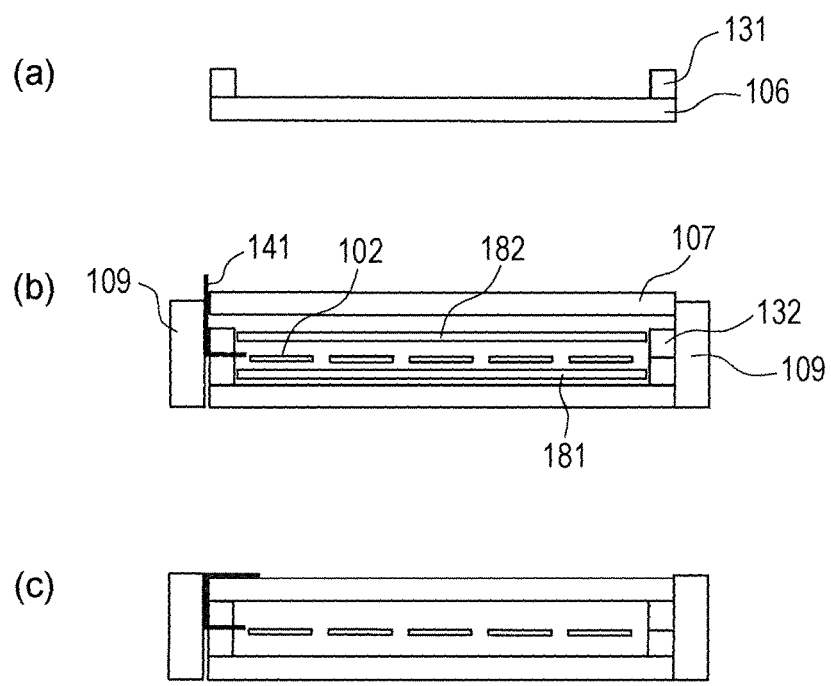
FIG. 25 illustrates another example of Embodiment 2 of the invention, and is a cross-sectional view illustrating a method of manufacturing the solar battery module.

FIG. 25 illustrates another example of this embodiment. FIGS. 25(*a*), 25(*b*), and 25(*c*) illustrate the protrusion prevention wall disposing process, the mounting process, and the sealing process. First, this example is different from the above-described example in that a spacer 109 is disposed on an outer side of ends of the solar battery module in which the protrusion prevention wall is disposed. As the spacer 109, a substantially rectangular parallelepiped formed from a silicone resin is used. A material of the spacer 109 is not limited to silicone resin, and Teflon (registered trademark), epoxy, glass, a metal, and the like may be used. In addition, a composite material of these materials is also possible. For example, a spacer in which a substantially rectangular copper parallelepiped is coated with a silicone resin may be used. When the spacer 109 has a structure using copper, it is possible to secure weight sufficient for the spacer at a low price. In addition, due to the coating with the silicone resin, even when the light-receiving surface side glass and the non-light-receiving surface side glass come into contact with each other, glass is not damaged, and thus it is possible to improve a production yield ratio. In addition, a spacer obtained by using a material in which glass fibers are mixed with epoxy is also possible. When glass fibers are mixed with epoxy, it is possible to provide strength to the spacer, and thus it is possible to repetitively use the spacer in the sealing process.

It is not necessary for the spacer to be brought into contact with the end of the solar battery module, and for example, the solar battery module and the spacer may be disposed with a space of several mm.

The sealing process is performed in a state in which the spacer is disposed. When the spacer is disposed, it is possible to prevent a thickness distribution from occurring in the solar battery module.

In this embodiment, description has been given to a structure in which two protrusion prevention walls are disposed to overlap each other. However, the number of the protrusion prevention walls is not limited to two, and this embodiment also includes a case where the number of the protrusion prevention walls is three or more. As the number of protrusion prevention walls, which overlap each other, increases, it is assumed that a pressure reducing time in the sealing process can be shortened.

In addition, the number of solar battery cells that constitute the solar battery string, and the number of solar battery strings that constitute the solar battery module are not limited to the numbers described in this embodiment, and may be designed in accordance with necessity.

<Embodiment 3>

Still another example of the invention will be described with reference to Embodiment 3. Embodiment 3 is different from Embodiment 2 in that at least a part of the lead-out electrode is coated with a protective film. The same reference numerals are given to the same configurations as Embodiment 2, and a detailed description thereof will not be repeated.

Figure 26:
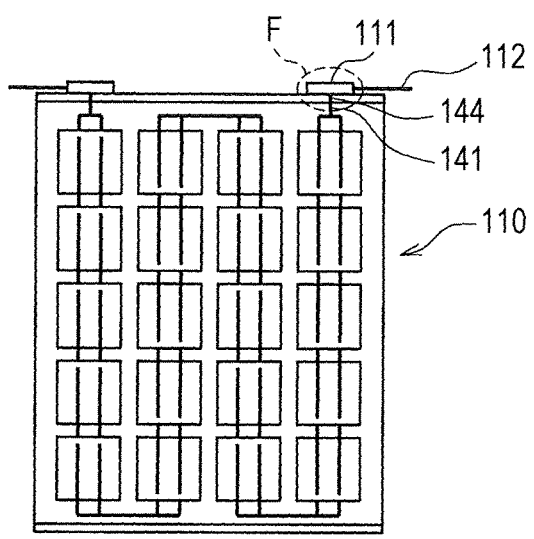
FIG. 26 illustrates Embodiment 3 of the invention, and is a plan view of a solar battery module when viewed from a light-receiving surface side.

FIG. 26 is a plan view of a solar battery module 110, which is manufactured in this embodiment, when viewed from the light-receiving surface side. A lead-out electrode 141 in which a part is coated with a protective film 144 is led out to the outside of a solar battery module 110 from between adjacent protrusion prevention walls. The lead-out electrode 141 that is led out is electrically connected to a terminal stage 113 inside a terminal box 111, and thus an outer connection cable 112 and solar battery cells are electrically connected.

Figure 27:
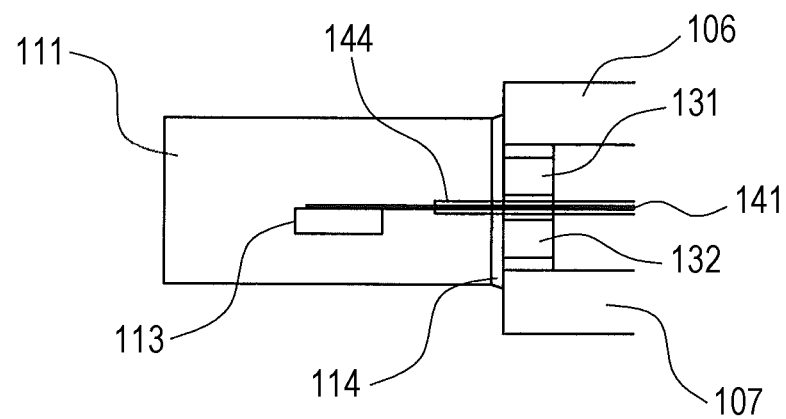
FIG. 27 illustrates Embodiment 3 of the invention, and is an enlarged cross-sectional view of a portion F of the solar battery module shown in FIG. 26.

FIG. 27 is an enlarged cross-sectional view illustrating a lead-out portion F of the lead-out electrode in FIG. 26. The lead-out electrode 141 extends to the outside of the solar battery module 110 through a light-receiving surface side protrusion prevention wall 131 and a non-light-receiving surface side protrusion prevention wall 132 which are interposed between a light-receiving surface side glass 106 and a non-light-receiving surface side glass 107, and a part of the lead-out electrode 141 is coated with the protective film 144. In this embodiment, the lead-out electrode 141 is coated with the protective film 144 except for a portion that is electrically connected to a solar battery cell, and a portion in which the lead-out electrode 141 is electrically connected to the terminal stage.

The terminal box 111 is bonded to an end of the solar battery module with an adhesive 114. It is preferable that the lead-out electrode 141 be coated up to a portion located inside a casing of the terminal box 111. In this embodiment, the lead-out electrode 141 is coated with the protective film to a position distant from an end surface of the light-receiving surface side glass or the non-light-receiving surface side glass by approximately 3 mm. When the lead-out electrode 141 has this configuration, bending is further less likely to occur at the end surface of the light-receiving surface side glass or the non-light-receiving surface side glass, particularly, at a portion in which the adhesive 114 is provided. This is because the thickness of the lead-out electrode 141 increases due to the protective film 144. If local bending is present in the lead-out electrode, in a case where repeated temperature changes is applied to the solar battery module, cracking may occur at a bent portion of the lead-out electrode. That is, in a case where the solar battery module, in which local bending is present in the lead-out electrode, is used outdoors for a long period of time, the lead-out electrode may be broken. When the lead-out electrode is coated with the protective film, local bending is prevented, and thus it is possible to secure long-term reliability of the solar battery module.

In addition, in a case where moisture intrudes from the adhesive 114, there is a possibility that the lead-out electrode 141 becomes highly resistive due to corrosion and generates heat. When heat is generated inside the adhesive, heat is transferred to the light-receiving surface side glass and the non-light-receiving side glass, and this may lead to glass cracking. When the lead-out electrode located inside the adhesive is coated with the protective film, it is possible to prevent corrosion of the lead-out electrode due to moisture.

It is preferable that the lead-out electrode 141 be covered with the protective film 144 up to a position that comes into contact with the sealing resin 108 on an inner side (a side in which the sealing resin is present) with respect to the end surface of the solar battery module. In this structure, it is possible to secure a high design property of the solar battery module over a long period of time. More specifically, in a case where the solar battery module is provided outdoors over a long period of time, the sealing resin may turn yellow or may become discolored at a position at which the lead-out electrode and the sealing resin come into direct contact with each other. However, when the lead-out electrode is coated with a highly stable member, turning yellow or discoloration is not recognized. This is assumed to be because oxidation of the sealing resin due to oxygen in air, which intrudes along a surface of the lead-out electrode, does not occur.

In addition, it is preferable to use a highly stable insulating member of such as polyimide as the protective film 144. When the protective film is used, it is possible to further improve weather resistance of the solar battery module. In addition, a risk of electric shock can be further reduced, and thus it is possible to improve stability of the solar battery module.

<Embodiment 4>

Still another example of the invention will be described with reference Embodiment 4. Embodiment 4 is different from Embodiment 2 in that a protrusion prevention wall disposing position in the solar battery module is different. The same reference numerals are given to the same configurations as Embodiment 2, and a detailed description thereof will not be repeated.

Figure 28:
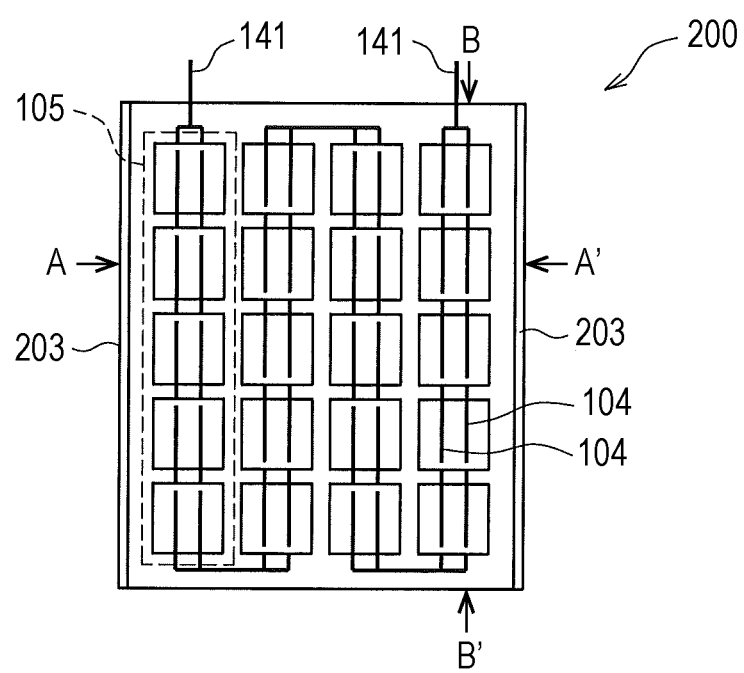
FIG. 28 illustrates Embodiment 4 of the invention, and is a plan view of a solar battery module when viewed from a light-receiving surface side.

FIG. 28 is a plan view illustrating a solar battery module 200, which is manufactured in this embodiment, when viewed from a light-receiving surface side. A protrusion prevention wall 203 is disposed on a pair of opposite ends which is approximately parallel with internal wires 104 that constitute a solar battery string 105. The protrusion prevention wall 203 is a substantially elongated rectangular parallelepiped, and has a length to cover an end of the solar battery module.

Figure 29:
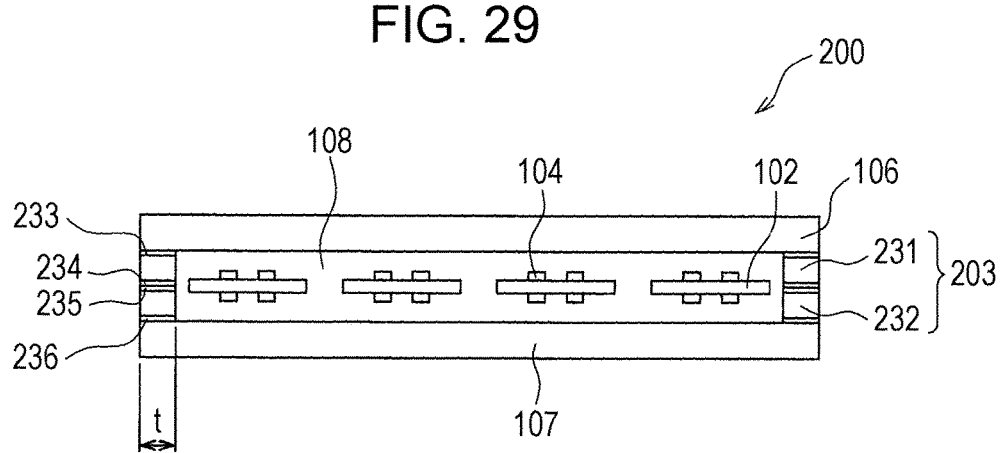
FIG. 29 illustrates Embodiment 4 of the invention, and is a cross-sectional view taken along line A-A' of the solar battery module shown in FIG. 28.
Figure 30:
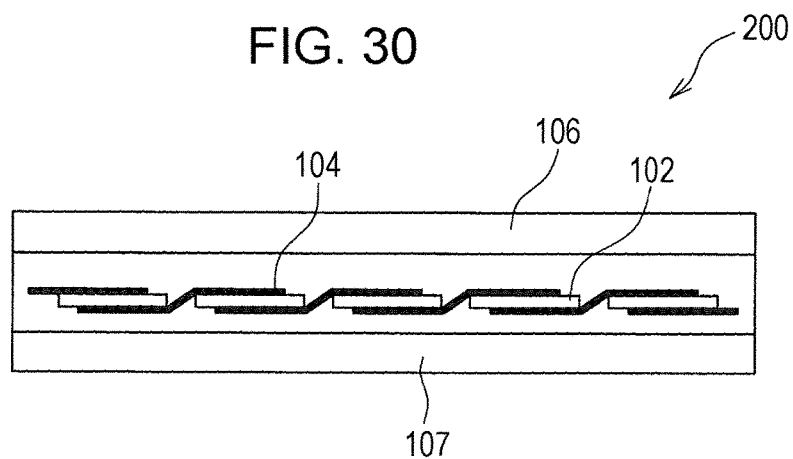
FIG. 30 illustrates Embodiment 4 of the invention, and is a cross-sectional view taken along line B-B' of the solar battery module shown in FIG. 28.

FIG. 29 is a cross-sectional view taken along line A-A' of the solar battery module shown in FIG. 28, and FIG. 30 is a cross-sectional view taken along line B-B'.

As shown in FIG. 29, the solar battery module 200 has a structure in which a plurality of electrically connected solar battery cells 102 are sealed between a light-receiving surface side glass 106 and a non-light-receiving surface side glass 107 with a sealing resin 108. Each of the solar battery cells 102 includes an internal wire 104 on a light-receiving surface side and on a non-light-receiving surface side, respectively. The protrusion prevention wall 203 is disposed between the light-receiving surface side glass 106 and the non-light-receiving surface side glass 107 at a pair of opposite ends of the solar battery module 200. The protrusion prevention wall 203 has a configuration in which two protrusion prevention walls including a light-receiving surface side protrusion prevention wall 231 and a non-light-receiving surface side protrusion prevention wall 232 are disposed to overlap each other in a thickness direction of the solar battery module 200. As each of the protrusion prevention walls, an acrylic resin foamed body is used. The protrusion prevention wall is not limited to the acrylic resin, and a urethane resin, a silicone resin, and a butyl rubber may be used. In addition, there is no limitation to the foamed body. The light-receiving surface side protrusion prevention wall 231 includes adhesive layers 233 and 234, and the adhesive layer 233 is bonded to a non-light-receiving surface side of the light-receiving surface side glass 106. The non-light-receiving surface side protrusion prevention wall 232 includes adhesive layers 235 and 236, and the adhesive layer 236 is bonded to a light-receiving surface side of the non-light-receiving surface side glass 107. In addition, the adhesive layer 234 is bonded to the adhesive layer 235. When an adhesive layer is provided to the protrusion prevention wall, adhesiveness can be provided between glass and the protrusion prevention wall in comparison to a case in which the adhesive layer is not provided, and thus it is possible to prevent a positional deviation with the protrusion prevention wall.

A width t of the protrusion prevention wall 203 is set to approximately 9 mm. The width t is preferably 5 mm to 10 mm. The protrusion prevention wall has a function of preventing the sealing resin 108 from protruding from an end of the solar battery module during the sealing process. In a case where the width t is less than 5 mm, a sufficient protrusion prevention function is not provided, and thus the width t is preferably 5 mm or more. In addition, a region in which the protrusion prevention wall is provided becomes a region that does not contribute to electric power generation. Therefore, when the width becomes too broad, electric power generation efficiency of the solar battery module does not increase. In addition, in a case of a lighting-type solar battery module, the region in which the protrusion prevention wall is provided becomes a region that does not contribute to lighting, and thus a lighting rate is not raised. Accordingly, it is not preferable to make the width t too large. In addition, the lighting-type solar battery module is frequently used as a window in architecture. In a case where the lighting-type solar battery module is used as a window, it is preferable to hide the protrusion prevention wall present at an end of the solar battery module with a window sash in consideration of a design property. From this reason, it is preferable that the width be 10 mm or less.

In addition, as shown in FIG. 30, when viewed form a cross-section along line B-B', the solar battery cells 102 adjacent to each other are connected to the internal wire 104 in series. The protrusion prevention wall is not disposed at a pair of both ends of the solar battery module 200 in a direction in which the plurality of solar battery cells constituting a solar battery string are connected to each other.

Next, a method of manufacturing the solar battery module of this embodiment will be described.

Figure 31:
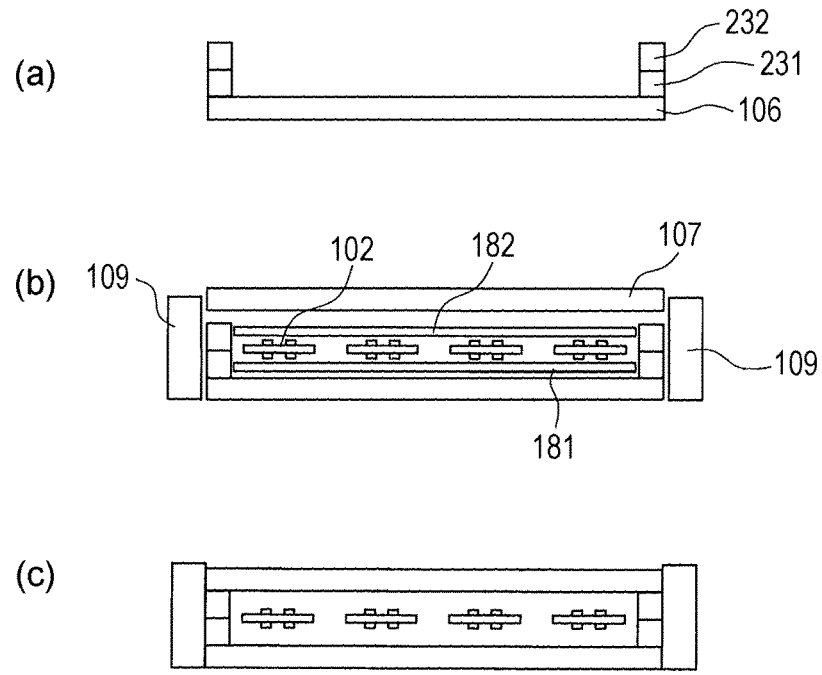
FIG. 31 illustrates Embodiment 4 of the invention, and is a cross-sectional view illustrating a method of manufacturing the solar battery module.

FIG. 31 is a cross-sectional view illustrating a method of manufacturing the solar battery module of this embodiment. FIGS. 31(a), 31(b), and 31(c) illustrate a protrusion prevention wall disposing process, a mounting process, and a sealing process, respectively, and correspond to a cross-section taken along line A-A' in FIG. 28.

First, a plurality of solar battery cells are electrically connected to the internal wires in series to form a solar battery string. As the internal wire, a tin-plated copper wire having a thickness of approximately 0.2 mm is used. Soldering is used for connection between the solar battery cell and the internal wire. Conductive paste may be used for the connection. Then, a plurality of solar battery strings are electrically connected to each other. For connection of the plurality of solar battery strings, a connection member having a thickness of approximately 0.2 mm is used.

The protrusion prevention wall disposing process will be described with reference to FIG. 31(a). The light-receiving surface side protrusion prevention wall 231 and the non-light-receiving surface side protrusion prevention wall 232 are mounted in this order on a non-light-receiving surface side of a pair of opposite ends of the light-receiving surface side glass 106. It is preferable that the number of protrusion prevention walls that are disposed to overlap each other be 2. This is because the manufacturing process does not become complicated. An acrylic resin foamed body including an adhesive layer is used for each of the light-receiving surface side protrusion prevention wall 231 and the non-light-receiving surface side protrusion prevention wall 232. The light-receiving surface side protrusion prevention wall 231 includes the adhesive layer. Accordingly, when being disposed on the non-light-receiving surface side of the light-receiving surface side glass 106, a positional deviation is less likely to occur, and thus it is possible to dispose the light-receiving surface side protrusion prevention wall 231 at an accurate position. In addition, when disposing the non-light-receiving surface side protrusion prevention wall 232 on the light-receiving surface side protrusion prevention wall 231, the same effect is obtained. In addition, it is also possible to prevent occurrence of the positional deviation due to movement of the protrusion prevention wall during transport to the subsequent process.

Next, the mounting process will be described with reference to FIG. 31(b).

A sealing resin 181 is disposed between the protrusion prevention walls that are disposed on a non-light-receiving surface side of a pair of opposite ends of the light-receiving surface side glass 6, and the solar battery cells 102 are disposed on the sealing resin 181 in a state in which a plurality of solar battery strings are electrically connected to each other. The sealing resin 182 and the non-light-receiving surface side glass 107 are disposed on the solar battery cell 102. As the sealing resins 181 and 182, sheet-shaped EVA is used. The sheet-shaped EVA that is used as the sealing resin 181 may be one sheet or a plurality of sheet. This is true of the sealing resin 182. The number of sheets may be determined in accordance with a design value of a distance between the light-receiving surface side glass 106 and the non-light-receiving surface side glass 107. In a case of sealing solar battery cells using a silicon substrate, it is necessary to reliably bury the solar battery cells and the internal wires, and thus it is necessary for a distance between the light-receiving surface side glass and the non-light-receiving surface side glass to be larger than in a thin film silicon solar battery.

In the protrusion prevention wall disposing process, the protrusion prevention wall is disposed on the opposite ends of the light-receiving surface side glass 106, and thus it is possible to dispose the sealing resin at an accurate position. In addition, the sheet-shaped EVA used as the sealing resin has low adhesiveness with glass before heating, and thus the positional deviation tends to occur after disposition. However, it is also possible to obtain an effect in which the positional deviation after disposition of the sealing resin is less likely to occur due to the protrusion prevention wall.

In addition, it is possible to temporarily fix the light-receiving surface side glass 106 and the non-light-receiving surface side glass 107 to each other through the protrusion prevention wall. Until now, there has been a problem that a positional deviation has tended to occur between the light-receiving surface side glass and the sealing resin, and between the sealing resin and the non-light-receiving surface side glass during transport of the solar battery module to the subsequent sealing process. However, the protrusion prevention wall with adhesiveness is disposed at opposite ends of the solar battery module, and thus it is possible to prevent the positional deviation during transport. As is the case with the example illustrated in FIG. 25 of Embodiment 2, a spacer 109 is disposed on outer sides of the pair of opposite ends of the solar battery module in which the protrusion prevention wall is disposed.

FIG. 31(c) is a view illustrating the sealing process. The sealing process is performed by the same method described in Embodiment 2. In addition, as is the case with Embodiment 2, a curing process may be performed after the sealing process.

Figure 32:
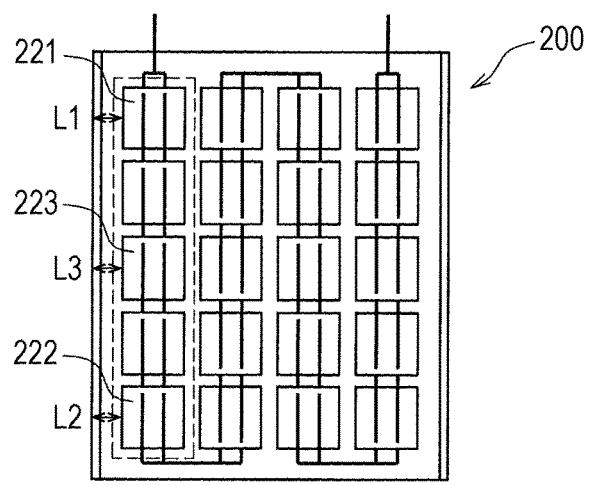
FIG. 32 illustrates Embodiment 4 of the invention, and is a plan view of the solar battery module when viewed from the light-receiving surface side.

Next, samples for comparison are prepared, and confirmation of the effect is performed. FIG. 32 is a view for illustration. FIG. 32 is a plan view of the solar battery module when viewed from the light-receiving surface side.

The solar battery module that is prepared by using this embodiment is set as Example 1, and the samples that are prepared for comparison are set as Example 2 and Comparative Example 1. Example 1 and Example 2 are different from each other in that in Example 2, the spacer is not disposed. Example 1 and Comparative Example 1 are different from each other in that in Comparative Example 1, both of the protrusion prevention wall and the spacer are not disposed.

Among a plurality of solar battery cells that constitute a solar battery string that is closest to an end of the solar battery module, a distance between a solar battery cell 221 on one end side and the end of the light-receiving surface side glass substrate was set as L1, and a distance between a solar battery cell 222 on the other end side and the end of the light-receiving surface side glass was set as L2. In addition, a distance between a solar battery cell 223 at a center side among the solar battery cells that constitute the solar battery string, and the light-receiving surface side glass was set as L3.

To confirm whether or not a positional deviation of the solar battery cell occurred before and after the sealing process, lengths of L1, L2, and L3 before the sealing process and lengths of L1, L2, and L3 after the sealing process were measured, and then each difference was calculated. The lengths were measured by Vernier calipers.

In Example 1, there was almost no variation in the lengths of L1, L2, and L3 before and after the sealing process. In other words, in Example 1, almost no bending occurred in the solar battery string. In Example 2, there was almost no variation in the lengths of L1 and L2, but L3 slightly lengthened. In other words, in Example 2, slight bending occurred in the solar battery string. In Comparative Example 1, there was almost no variation in the lengths of L1 and L2, but L3 lengthened. In other words, in Comparative Example 1, bending larger than that of Example 2 occurred in the solar battery string. When comparing Example 1, Example 2, and Comparative Example 1, it can be seen that in a case where the protrusion prevention wall is not present, the solar battery string bends and thus a large positional deviation in positions of the solar battery cells when considering that the protrusion prevention wall is not present only in Comparative Example 1. This is considered to be because when the sealing resin enters a softened state, the sealing resin protrudes from the end of the solar battery module, and flowing also occurs at the inside, and thus positions of the solar battery cells are changed.

In the sealing process, when positional deviation occurs in the solar battery cells, there is a problem that the design property of the solar battery module deteriorates. In addition, when positional deviation occurs in the solar battery cells, local bending occurs in the internal wire that connects the solar battery cells adjacent to each other. When local bending occurs in the internal wire, in a case where repeated temperature changes are applied to the solar battery module, cracking may occur in the internal wire at a bent portion. That is, in a case where the solar battery module, in which positional deviation occurs in the solar battery cells, is used outdoors for a long period of time, the internal wire may be broken. When the protrusion prevention wall is disposed, the positional deviation of the solar battery cells is prevented in the sealing process, and thus a high design property is secured, and it is possible to secure long-term reliability of the solar battery module.

In addition, in the sealing process, a fixing tape may be bonded to between the solar battery cells to prevent the positional deviation of the solar battery cells in the sealing process. In a case where the solar battery module using the fixing tape is installed outdoors for a long period of time, the fixing tape deteriorates and turns yellow due to solar light. In a case of the solar battery module having a laminated glass structure, turning yellow of the fixing tape leads to a decrease in the design property of the solar battery module. According to the invention, it is possible to prevent the positional deviation of the solar battery cells without using the fixing tape, and thus it is also possible to obtain an effect of securing a high design property of the solar battery module having the laminated glass structure over a long period of time.

In addition, when comparing Example 1 and Example 2 to each other, it can be seen that even when the protrusion prevention wall is provided, but the spacer is not present, the position of the solar battery cells is slightly changed. In other words, it can be seen that the spacer also has an effect of preventing the position of the solar battery cells from being changed. This is considered to be because when the spacer is disposed, a variation in a thickness direction of the solar battery module is suppressed, and thus it is possible to suppress flowing of the sealing resin. That is, it is assumed that in Example 1 illustrated in this embodiment, the protrusion prevention wall and the spacer are disposed, and thus the positional deviation of the solar battery cells can be prevented with higher accuracy.

Next, in Example 1, Example 2, and Comparative Example 1, the thickness of the solar battery module after the sealing process was measured by using Vernier calipers to calculate a thickness distribution. At a total of eight portions including four portions at corners of the solar battery module, and four portions at the center of respective sides, the thickness measurement was performed at a portion 10 mm further inward toward the center.

In Example 1, almost no thickness distribution occurred, but in Example 2 and Comparative Example 1, the distribution occurred. From these results, it can be seen that when the spacer is disposed, it is possible to prevent thickness distribution from occurring in the solar battery module during the sealing process. More specifically, the thickness distribution was larger in Comparison Example 1 in comparison to Example 2. It is considered that disposition of the protrusion prevention wall also has an effect of preventing thickness distribution from occurring.

In this embodiment, description has been given to a structure in which two protrusion prevention walls are disposed to overlap each other. However, the number of the protrusion prevention walls is not limited to two, and this embodiment also includes a case where the number of the protrusion prevention walls is three or more. As the number of protrusion prevention walls, which overlap each other, increases, it is assumed that a pressure reducing time in the sealing process can be shortened.

In addition, the number of solar battery cells that constitute the solar battery string, and the number of solar battery strings that constitute the solar battery module are not limited to the numbers described in this embodiment, and may be designed in accordance with necessity.

<Embodiment 5>

Still another example of the invention will be described with reference to Embodiment 5. Embodiment 5 is different from Embodiment 2 and Embodiment 4 in that the protrusion prevention wall is disposed at all ends of the solar battery module. The same reference numerals are given to the same configurations as in Embodiment 2 and Embodiment 4, and a detailed description thereof will not be repeated.

Figure 33:
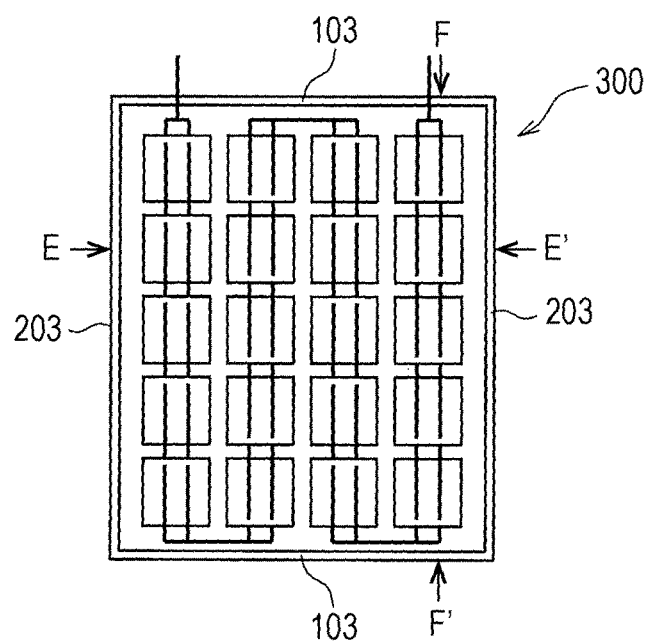
FIG. 33 illustrates Embodiment 5 of the invention, and is a plan view of a solar battery module when viewed from a light-receiving surface side.

FIG. 33 is a plan view illustrating a solar battery module 300, which is manufactured in this embodiment, when viewed from the light-receiving surface side. In a solar battery module 300, a protrusion prevention wall is disposed on a peripheral portion at all four sides. That is, the solar battery module 300 is an example in which both of the protrusion prevention wall 103 in Embodiment 2 and the protrusion prevention wall 203 in Embodiment 4 are disposed.

Figure 34:
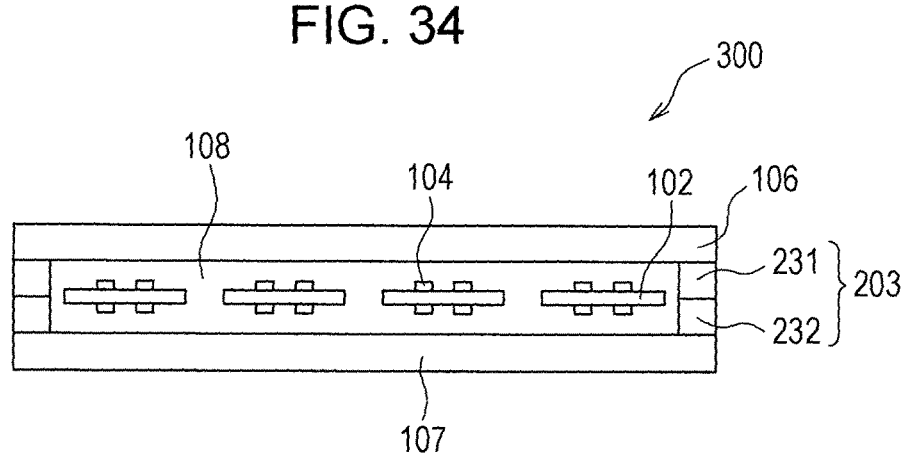
FIG. 34 illustrates Embodiment 5 of the invention, and is a cross-sectional view taken along line E-E' of the solar battery module shown in FIG. 33.
Figure 35:
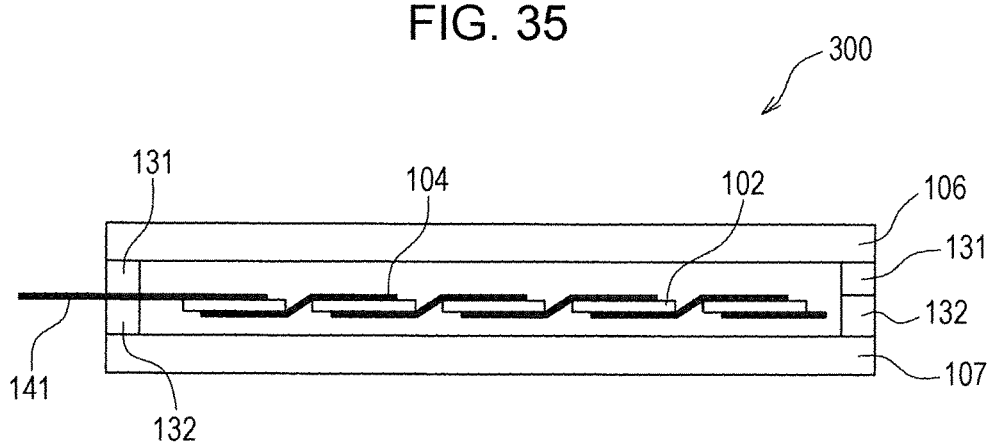
FIG. 35 illustrates Embodiment 5 of the invention, and is a cross-sectional view taken along line F-F' of the solar battery module shown in FIG. 33.
Figure 36:
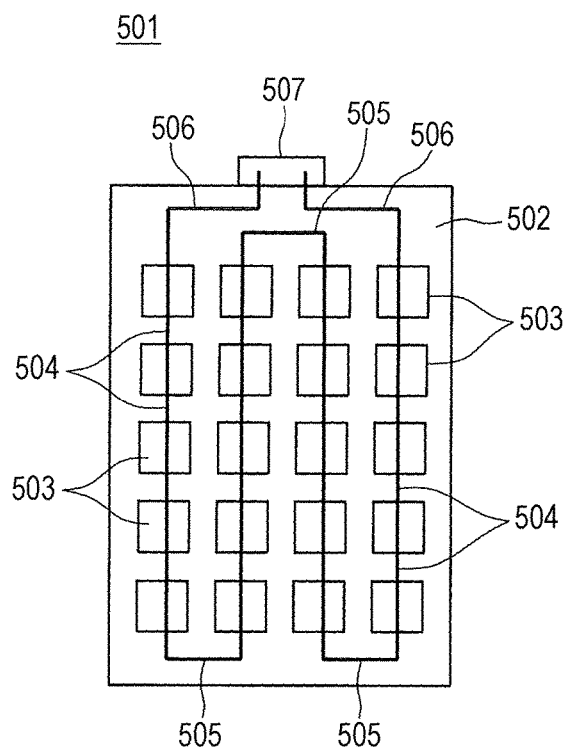
FIG. 36 is a view schematically illustrating an example of a solar battery module of the related art.

FIG. 34 is a cross-sectional view taken along line E-E' of the solar battery module shown in FIG. 33. FIG. 35 is a cross-sectional view taken along line F-F' of the solar battery module shown in FIG. 33.

In the solar battery module 300, a lead-out electrode 141 is led out from between two protrusion prevention walls. The lead-out electrode 141 is led out from between the protrusion prevention walls, and thus it is possible to lead out the lead-out electrode to be approximately parallel with a light-receiving surface side glass and a non-light-receiving surface side glass without bending of the lead-out electrode at an end. As is the case with Embodiment 3, a portion of the lead-out electrode, which does not relate to electrical connection with a solar battery cell, may be coated with a protective film 144.

In addition, the protrusion prevention wall is disposed on all ends of the solar battery module, and thus almost no positional deviation of solar battery cells occurs. As a result, positional accuracy is further improved. According to this, it can be said that the design property of the solar battery module is further improved. In addition, a sealing resin does not protrude from any end of the solar battery module, and thus it is not necessary to peel off the sealing resin that protrudes from the end during a manufacturing process. As a result, it is possible to reduce the number of processes. In addition, it is also possible to prevent contamination of the laminating apparatus, which is a sealing apparatus, due to the sealing resin that protrudes from the end of the solar battery module.

Next, a method of manufacturing the solar battery module 300 of this embodiment will be described on the basis of differences from Example 2 and Example 4.

In the protrusion prevention wall disposing process shown in FIG. 31(a), only the light-receiving surface side protrusion prevention wall 131 is disposed at an end through which the lead-out electrode is led out and the non-light-receiving surface side protrusion prevention wall 132 is not disposed at the end. With regard to three ends other than the end through which the lead-out electrode is led out, a non-light receiving surface side protrusion prevention wall is disposed on a light-receiving surface side protrusion prevention wall to overlap therewith.

Next, in the mounting process shown in FIG. 31(b), when disposing solar battery cells after disposing a sealing resin 181, a lead-out electrode 141 is disposed on the light-receiving surface side protrusion prevention wall 131 that is disposed in the protrusion prevention wall disposing process. Then, the non-light-receiving surface side protrusion prevention wall 132 is disposed in order for the lead-out electrode 141 to be interposed between the light-receiving surface side protrusion prevention wall 131 and the non-light-receiving surface side protrusion prevention wall 132. The light-receiving surface side protrusion prevention wall 131 and the non-light-receiving surface side protrusion prevention wall 132 are bonded to each other by an adhesive layer, and thus almost no space is present at the periphery of the lead-out electrode 141.

Then, a sealing resin 182 and a non-light-receiving surface side glass 107 are disposed.

In addition, when manufacturing the solar battery module of this embodiment, a spacer is disposed at all ends of the solar battery module in a protrusion prevention wall disposing process and a sealing process. The spacer is disposed at all ends of the solar battery module, and thus uniformity in a thickness direction of the solar battery module is further improved.

As the spacer, a frame-shaped spacer, which can be disposed at all ends of the solar battery module at one time, is used. In a case where spacers are scattered, a positional deviation tends to occur between the solar battery module and the spacers during transport by using a conveyor, and thus it is necessary to use an auxiliary member for transport. When the frame-shaped spacer is used, it is possible to transport the solar battery module without using the auxiliary member during transport from the protrusion prevention wall disposing process to the sealing process by using a conveyor.

In this embodiment, description has been given to a case in which the lead-out electrode 141 is led-out from the end of the solar battery module. However, a method in which the lead-out electrode is led out from another position to the outside of the solar battery module may be used. As an example, it is also possible to use a method in which a hole is formed in the non-light-receiving surface side glass 107, and the lead-out electrode is led out to a non-light-receiving surface side of the solar battery module through the hole.

Hereinbefore, specific description has been given to Embodiment 1 to Embodiment 5, but the invention is not limited thereto. An embodiment obtained by appropriately combining technical means disclosed in each of the five embodiments is also included in the technical scope of the invention.

In addition, the disclosed embodiments are illustrative only, and do not become the basis of limited interpretation. Accordingly, the technical scope of the invention is not interpreted only in accordance with the above-described embodiments, and is defined on the basis of description of the appended claims. In addition, all modifications in equivalent meaning and range of the appended claims are included in the invention.

INDUSTRIAL APPLICABILITY

The present invention can be generally and widely applied to a solar battery module and a method of manufacturing a solar battery module.

REFERENCE SIGNS LIST 1, 100, 110, 200, 300: Solar battery module
2a: Light-receiving surface glass plate 2b: Rear surface glass plate
3, 102: Solar battery cell
4a, 4b: Sealing resin
5a, 5b: Double-sided adhesive tape
6: Interconnector
7: Connection bus bar
7a: First bar member
7b: Second bar member
11: Positive electrode bus bar
11a: First bar member
11b: Second bar member
12: Negative electrode bus bar
12a: First bar member
12b: Second bar member
12c, 12d: Bar member
13a, 13b: Positive electrode output terminal
14a, 14b: Negative electrode output terminal
15: Positive electrode box
16: Negative electrode box
17: Diode box
18: Positive electrode cable
19: Negative electrode cable
21: Bypass diode
22, 24, 27: Insulating member
22a: First insulating member
22b: Second insulating member
23, 25: Insulating coating resin
26: Auxiliary bar member
103, 203: Protrusion prevention wall
131, 231: Light-receiving surface side protrusion prevention wall
132, 232: Non-light-receiving surface side protrusion prevention wall
104: Internal wire
141, 142, 143: Lead-out electrode
144: Protective film
105: Solar battery string
106, 161, 162: Light-receiving surface side glass
107, 171, 172: Non-light-receiving surface side glass
108, 181, 182: Sealing resin
109: Spacer
111: Terminal box
112: External connection cable
113: Terminal stage
114: Adhesive

The invention claimed is:

1. A solar battery module comprising:
a plurality of electrically connected solar battery cells sealed between a light-receiving surface side glass and a non-light-receiving surface side glass by a sealing resin,
a protrusion prevention wall provided between the light-receiving surface side glass and the non-light-receiving surface side glass at a pair of opposite ends of the solar battery module,
wherein the protrusion prevention wall comprises a plurality of protrusion prevention wall strips disposed to overlap one another in a thickness direction of the solar battery module and to space the sealing resin from the pair of opposed ends of the solar battery module;
wherein the protrusion prevention wall strips comprise discrete double-sided adhesive tapes including an adhesive layer that exhibits no flowability by heat, edges of the tapes being aligned with ends of the light-receiving surface side glass and the non-light-receiving surface side glass whereby the sealing resin does not protrude beyond the ends of the light-receiving surface side glass and the non-light-receiving surface side glass; and
wherein in one end of the solar battery module, a lead-out electrode is led out from between the protrusion prevention wall strips adjacent to each other.

2. The solar battery module according to claim 1,
wherein the protrusion prevention wall strips each include an adhesive layer.

3. The solar battery module according to claim 1,
wherein a width of the protrusion prevention wall in a direction to space the sealing resin from the pair of opposed ends of the solar battery module is 5 mm to 10 mm.

4. A solar battery module comprising:
a light receiving-glass plate;
a rear glass plate;
plural electrically connected solar battery cells sealed between the light-receiving glass plate and the rear glass plate in a sealing resin;
two discrete walls configured separately from the sealing resin, provided at each of at least two opposing edges of the light-receiving glass plate and the rear glass plate, and provided between aligned ones of the opposing edges of the light-receiving glass plate and the rear glass plate, and configured to contain the sealing resin between the light-receiving glass plate and the rear glass plate;
wherein the walls comprise double-sided adhesive tapes including an adhesive layer that exhibits no flowability by heat, edges of the tapes being aligned with edges of the light-receiving glass plate and the rear glass plate whereby the sealing resin does not protrude beyond the edges of the light-receiving glass plate and the rear glass plate; and
wherein in one end of the solar battery module, a lead-out electrode is led out from between the protrusion prevention walls adjacent to each other.

5. The solar battery module according to claim 4, wherein the walls are configured to prevent protrusion of the sealing resin beyond the opposing edges and to prevent an intrusion between the light-receiving glass plate and the rear glass plate.

6. The solar battery module according to claim 4, wherein the walls comprise two wall strips interposed between the light-receiving glass plate and the rear glass plate in an overlapping manner with respect to a width direction of the module, the width direction being perpendicular to a plane of the light-receiving glass plate.

7. The solar battery module according to claim 6, wherein the two wall strips comprise double-sided adhesive tapes.

8. The solar battery module according to claim 6, further comprising an electrical lead connected to the plural electrically connected solar battery cells, the lead extending between the two wall strips.

9. The solar battery module according to claim 4, wherein in a direction parallel to a plane of the light-receiving glass plate the walls have a width in a range of from 5 mm to 10 mm.

10. The solar battery module according to claim 2, wherein the adhesive layer is disposed on each of both surfaces of the respective protrusion prevention wall strips, both surfaces facing the light-receiving surface side and the non-light-receiving surface side.

* * * * *